(12) United States Patent
Miyazawa

(10) Patent No.: US 7,148,508 B2
(45) Date of Patent: Dec. 12, 2006

(54) WIRING SUBSTRATE, ELECTRONIC DEVICE, ELECTRO-OPTICAL DEVICE, AND ELECTRONIC APPARATUS

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 143 days.

(21) Appl. No.: 10/383,075

(22) Filed: Mar. 7, 2003

(65) Prior Publication Data

US 2004/0079937 A1   Apr. 29, 2004

(30) Foreign Application Priority Data

Mar. 20, 2002   (JP)   ............................. 2002-079509

(51) Int. Cl.
*H01L 29/04*   (2006.01)

(52) U.S. Cl. .......................... 257/72; 257/59

(58) Field of Classification Search ................ 257/59, 257/72
See application file for complete search history.

(56) References Cited

U.S. PATENT DOCUMENTS

| | | | |
|---|---|---|---|
| 4,539,507 A | 9/1985 | VanSlyke et al. ............ 313/504 |
| 5,912,913 A | 6/1999 | Kondow et al. | |
| 6,184,159 B1 * | 2/2001 | Lou et al. .................... 438/791 |
| 6,297,557 B1 * | 10/2001 | Bothra ......................... 257/767 |
| 6,392,255 B1 * | 5/2002 | Shibata et al. ................. 257/59 |
| 6,426,245 B1 | 7/2002 | Kawasaki et al. | |
| 6,445,259 B1 * | 9/2002 | Thompson et al. ......... 333/17.3 |
| 6,545,319 B1 * | 4/2003 | Deane et al. ................. 257/350 |
| 6,689,492 B1 * | 2/2004 | Yamazaki et al. .......... 428/690 |
| 6,700,330 B1 * | 3/2004 | Koyama ................... 315/169.3 |
| 6,933,574 B1 * | 8/2005 | Park et al. ................... 257/359 |

6,936,846 B1   8/2005   Koyama et al.

FOREIGN PATENT DOCUMENTS

| | | |
|---|---|---|
| JP | 53-112732 | 10/1978 |
| JP | A-57-9051 | 1/1982 |
| JP | A-57-51781 | 3/1982 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A 11-024604 | 1/1999 |
| JP | A 11-065487 | 3/1999 |
| JP | A 2000-331991 | 11/2000 |
| JP | A 2001-085703 | 3/2001 |
| JP | A 2001-284297 | 10/2001 |
| JP | A 2002-006777 | 1/2002 |
| JP | A 2002-026122 | 1/2002 |
| KR | A-2001-0012686 | 2/2001 |
| WO | WO98/36406 | 8/1998 |
| WO | WO/A-99-48339 | 9/1999 |

OTHER PUBLICATIONS

Thomas, Ian M., "Porous fluoride antireflective coatings", *Applied Optics*, vol. 27, No. 16, Aug. 15, 1988, pp. 3356-3358.

* cited by examiner

*Primary Examiner*—Gene M. Munson
(74) *Attorney, Agent, or Firm*—Oliff & Berridge, PLC

(57) ABSTRACT

The invention achieves stable performance, such as low parasitic capacitance generated at conductive components. Components having a low dielectric constant of 4 or less are disposed on a base member. Functional films partitioned by the low-dielectric-constant components are also provided.

11 Claims, 15 Drawing Sheets

FIG. 4
(a)
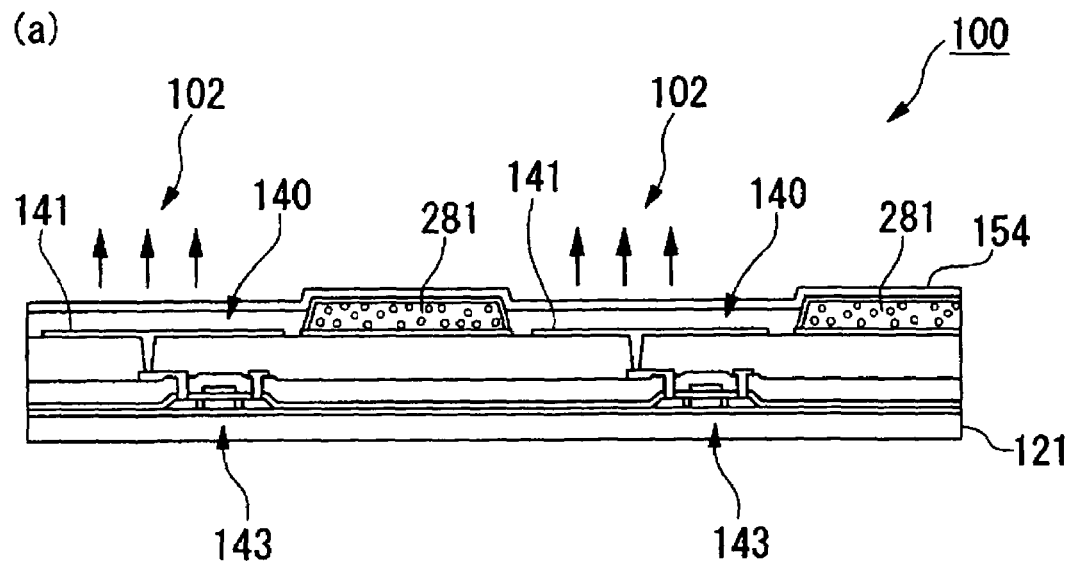
(b)
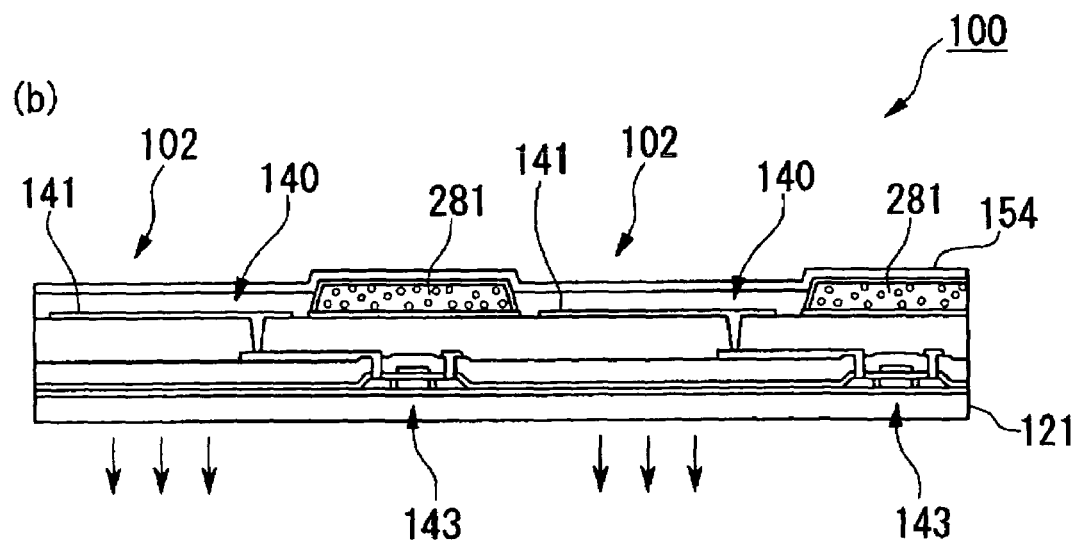

FIG. 5
(a)
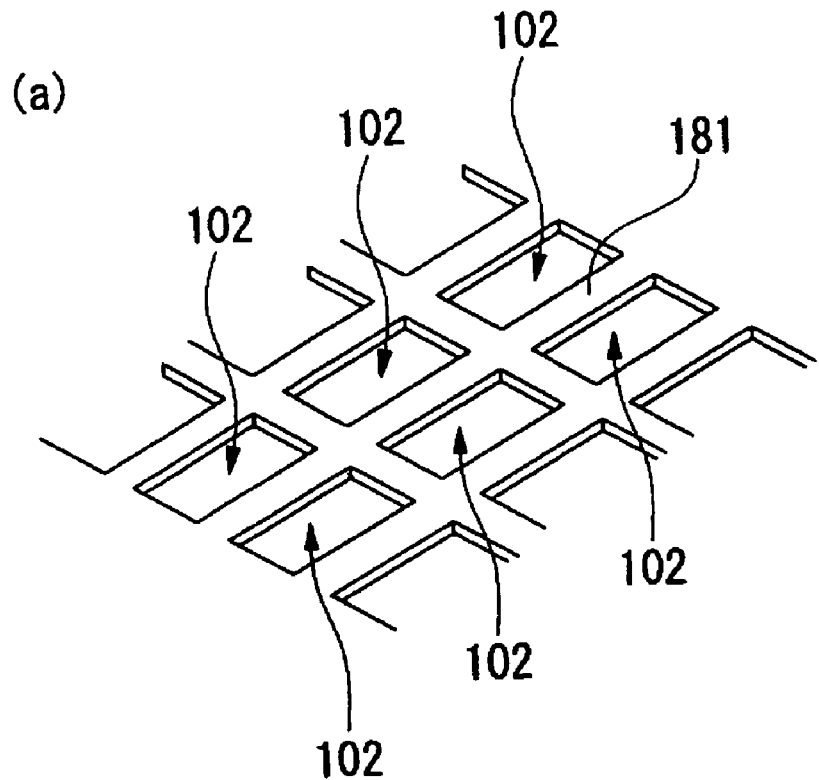
(b)
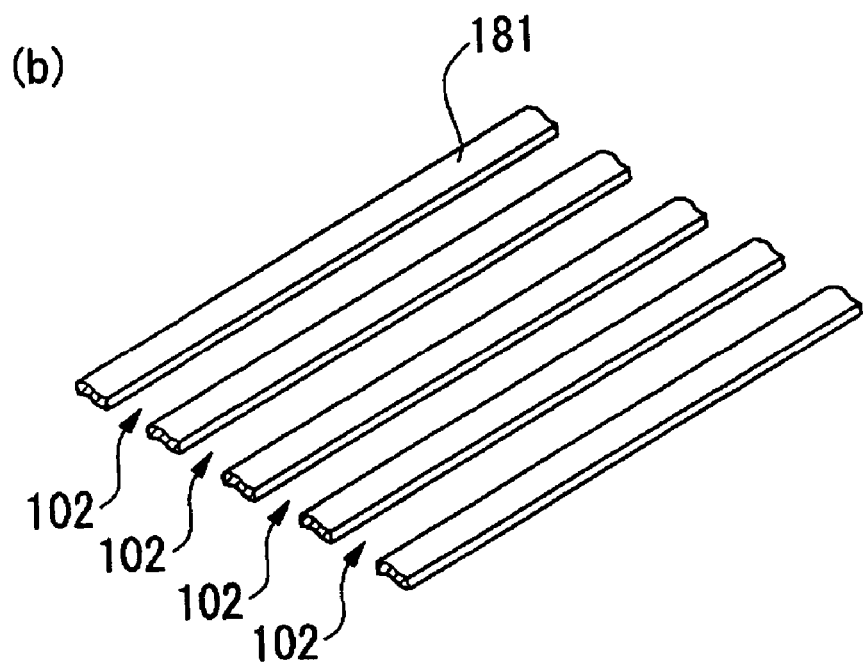

FIG. 7
(a)
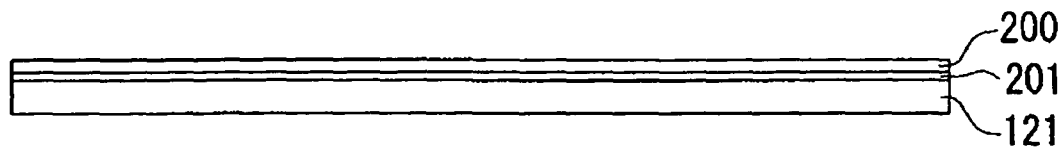
(b)
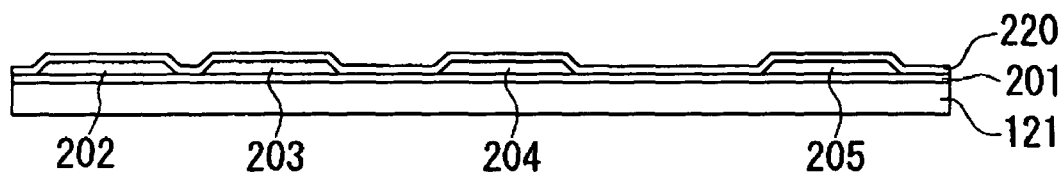
(c)
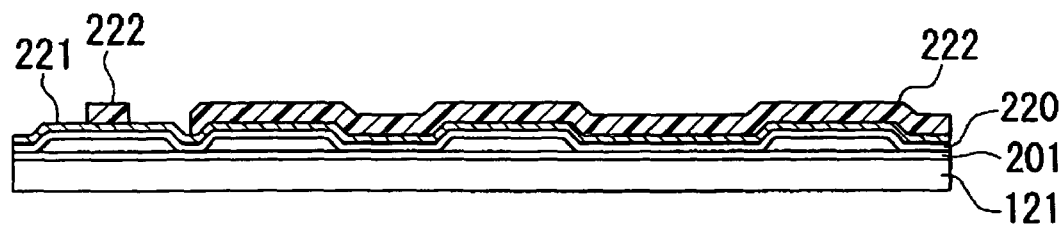
(d)
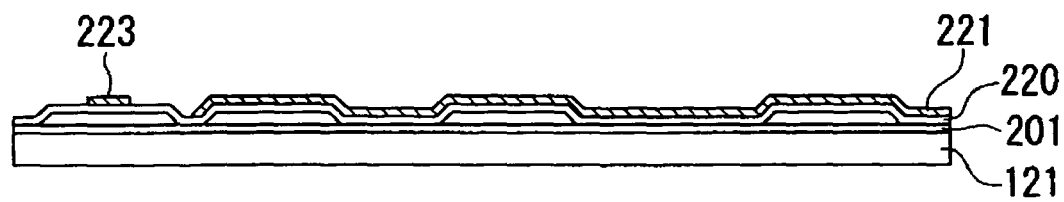
(e)
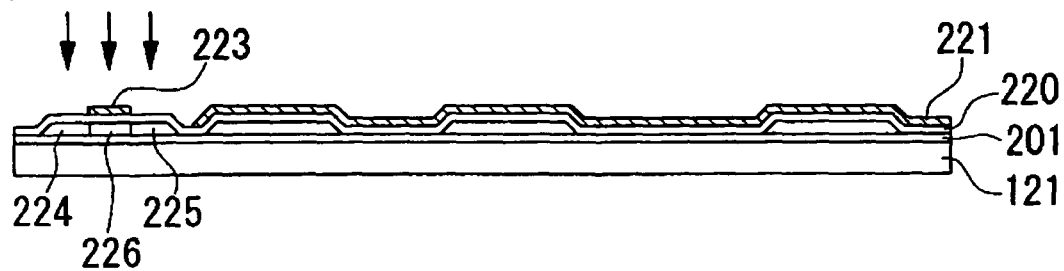

FIG. 8
(a)
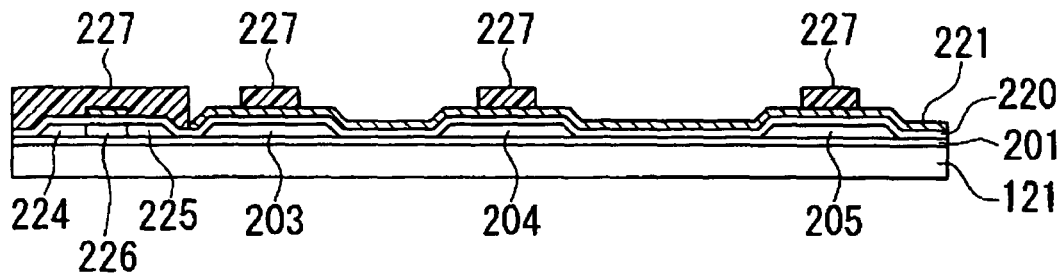
(b)
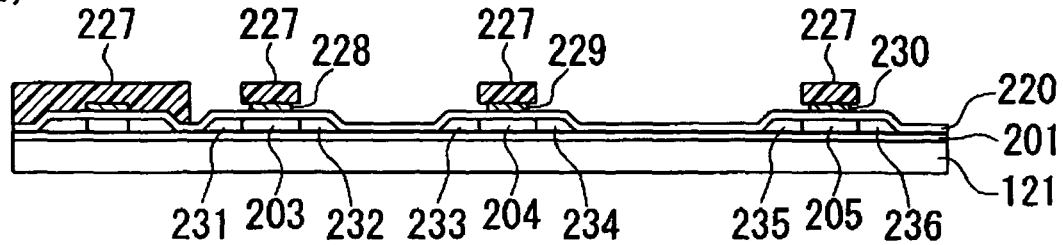
(c)
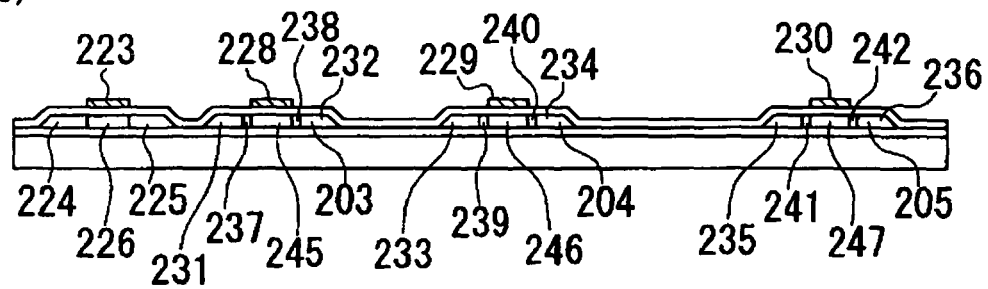
(d)
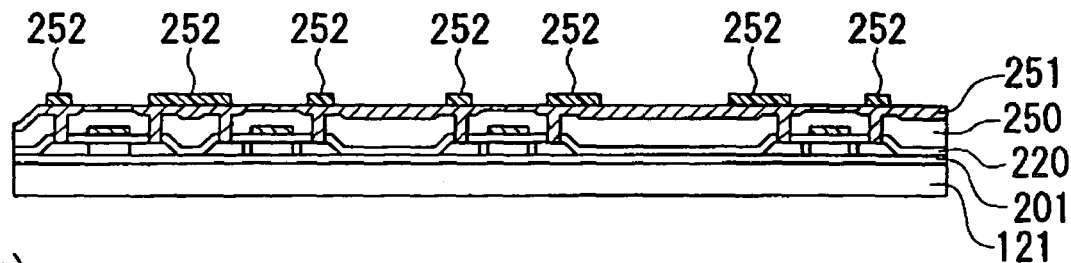
(e)
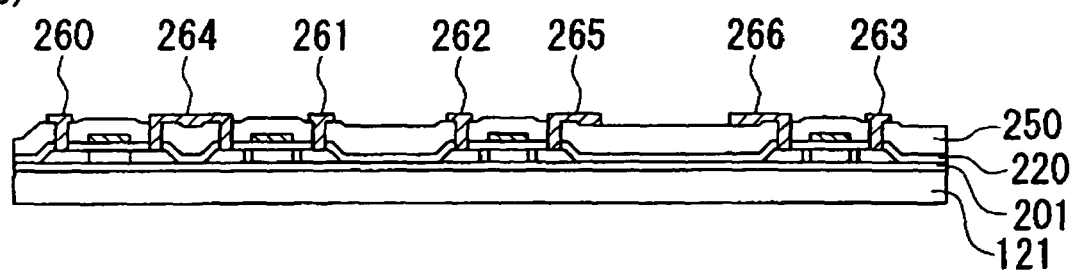

FIG. 9
(a)
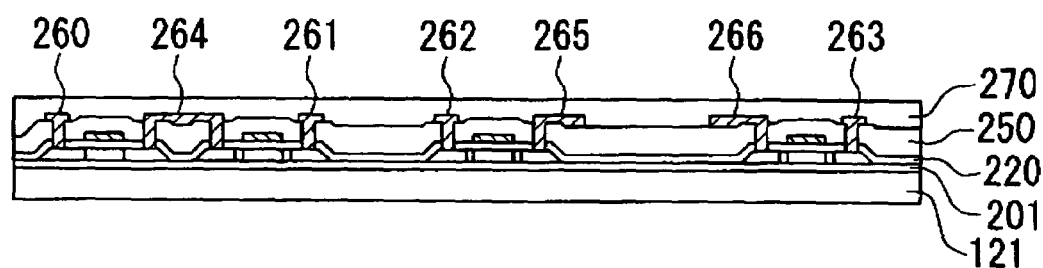
(b)
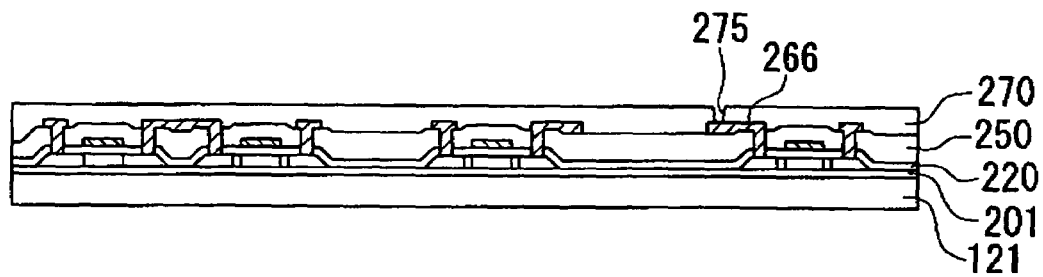
(c)
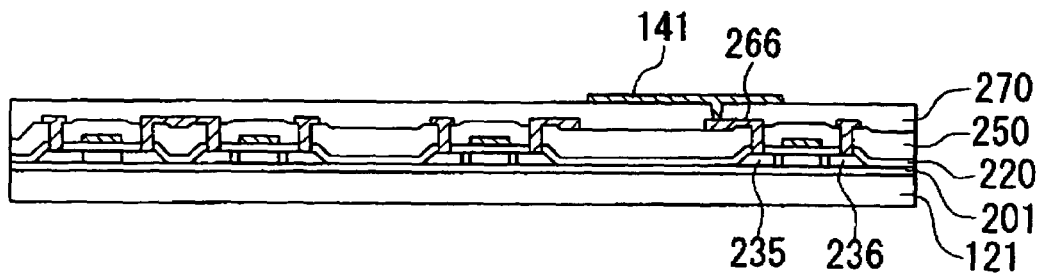

FIG. 14
(a)
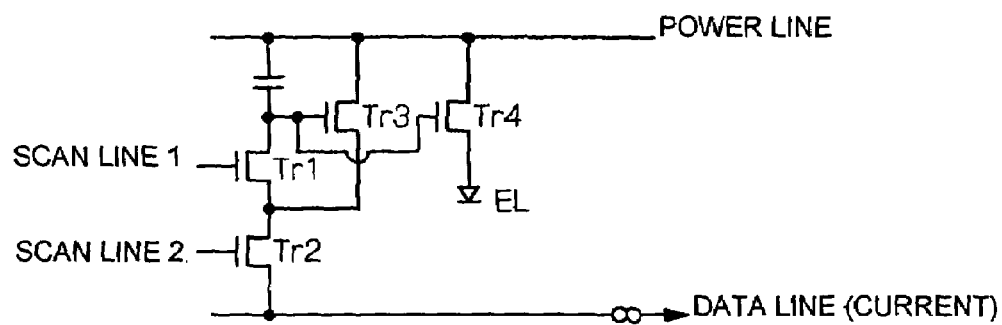
(b)
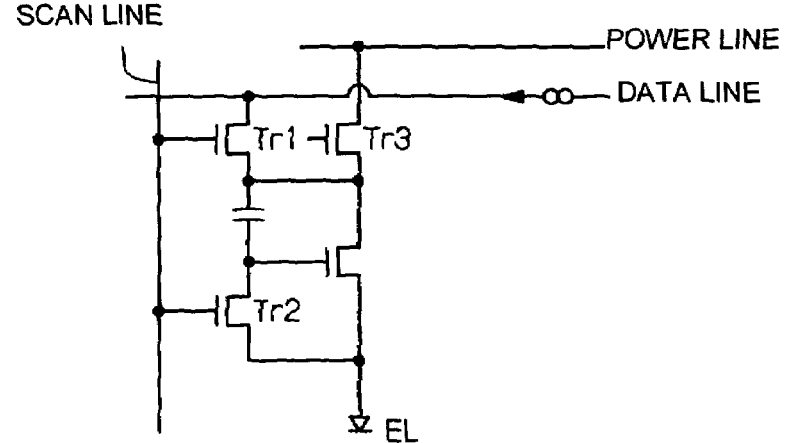

WIRING SUBSTRATE, ELECTRONIC DEVICE, ELECTRO-OPTICAL DEVICE, AND ELECTRONIC APPARATUS

BACKGROUND OF THE INVENTION

1. Field of Invention

The present invention relates to electronic devices, such as electro-optical devices or semiconductor devices, a wiring substrate suitable for use in electronic devices, an electro-optical device suitable for use in display devices, and an electronic apparatus.

2. Description of Related Art

The related art includes electro-optical devices that are usable as display devices, such as liquid crystal display devices including liquid crystal elements, and organic electroluminescent display devices including organic electroluminescent elements (hereinafter "organic EL elements"). In particular, organic EL display devices have superior display characteristics in that they are highly bright and self-luminous, can be driven by low DC voltages, and have fast response. Moreover, they can achieve thickness reduction, weight reduction, and power-consumption reduction of display devices, for example, as disclosed in International Publication No. WO98/36406 pamphlet).

SUMMARY OF THE INVENTION

Related art electro-optical devices suffer from parasitic capacitance generated between wiring lines and the like during data-overwriting operation or the like. The capacitance between wiring lines is dependent on the length of the wiring lines and increases as the length of the wiring lines increases. This has posed a problem in fabricating large screen display devices using electro-optical devices.

Moreover, in related art semiconductor devices, such as memories, an increase in both the number of components per chip and the speed of operation is required. Thus the problem caused by the capacitance between conductive parts such as wiring lines is particularly acute.

The present invention addresses or solves the above and/or other problems, and provides a wiring substrate that can produce stable performance, an electro-optical device that can be used in a large screen display and that can operate stably over a long period of times, and an electronic apparatus using the same.

In order to address or achieve the above, a first wiring substrate of the present invention is a substrate including a base member having wiring lines, and components having a dielectric constant of 4 or less disposed on the upper face of the base member. The base member has a region not provided with the components.

A dielectric constant of a silicon oxide film is generally 4.2, and thus the components have such a low dielectric constant. In the wiring substrate of the present invention, since components having a low dielectric constant of 4 or less is disposed on base member, for example, when an electro-optical material is disposed in a region not provided with the component, and conductive parts, such as electrodes are formed on the electro-optical material, parasitic capacitance generated at the conductive parts and wiring lines can be reduced.

A second wiring substrate of the present invention is a substrate including a base member having an insulating substrate and wiring lines, and components disposed on the upper face of the base member. The base member has a region not provided with the components, the wiring lines are disposed between the insulating substrate and the upper face of the base member, and a dielectric constant of the components is lower than that of the insulating substrate.

When the insulating substrate is used in display device and the like, for example, silica or glass and the like is preferably used as the insulating substrate. In such a case, the dielectric constant of the components is preferably 4 or less.

In the above-described wiring substrate, the dielectric constant of the components is 3 or less, more preferably 2.5 or less. A plurality of such regions may be provided on the base member.

In the above-described wiring substrate, for example, when active elements are included in the base member, the parasitic capacitance is reduced. Thus, the active element can be operated by drive signals with high frequency or high speed. Examples of the active elements include semiconductor elements such as transistors and two-port elements such as MIMs.

Further, in the above-described wiring substrate, the components are for example, a spin-on-glass film, a diamond film or a fluorinated amorphous carbon film including one of silica glass, alkylsiloxane polymers, alkylsilsesquioxane polymers, hydride alkylsilsesquioxane polymers, and polyaryl ethers.

The components may be porous.

In particular, the components may be composed of aerogel, porous silica, gel containing dispersed microparticles of magnesium fluoride, fluoric polymers, porous polymers, and a predetermined substance containing microparticles.

An electronic device of the present invention has functional films corresponding to the region of the substrate described above.

In the above-described electronic device, the components disposed between the functional films have a very low dielectric constant, and thus a parasitic capacitance generated between the functional films can be reduced.

In the above-described electronic device, when the conductive films, such as electrodes, are disposed above the functional films, the wiring lines and the electrodes are separated by the components, and thus a parasitic capacitance generated between the electrodes and the wiring lines can be reduced. Particularly, when the wiring lines supply signals, problems such as delay or rounding of signal can be reduced. The raw material to form the conductive film includes, for example, an organic conductive material, an inorganic conductive material (metal) and the mixtures thereof.

Further, in the above-described electronic device, the components are not limited to those disposed completely around the functional films.

A first electro-optical device of the present invention includes a base member having an insulating substrate and wiring lines, a plurality of pixel electrodes disposed on the upper face of the base member, a counter electrode disposed above the pixel electrodes, functional films having an electro-optical material disposed between each pixel electrode and the counter electrode, and components disposed between the counter electrode and the upper face of the base member and provided around the functional films, wherein a dielectric constant of the components is lower than that of the insulating substrate.

In the above-described electro-optical device, silica, glass or the like is preferably used as the insulating substrate. In such a case, the dielectric constant of the components is preferably 4 or less.

A second electro-optical device of the present invention includes a base member having wiring lines, a plurality of pixel electrodes disposed on the base member, a counter electrode disposed above the pixel electrodes, a functional films having an electro-optical material disposed between each pixel electrode and the counter electrode, and components disposed between the counter electrode and the surface of the base member and provided around the functional films. A dielectric constant of the components is 4 or less.

In the above-described electro-optical device, the dielectric constant of the components is preferably 3 or less or more preferably 2.5 or less.

Examples of the electro-optical material include organic electroluminescence materials and materials used in a liquid crystal elements, electrophoretic elements, and electron emission elements.

In the above-described electro-optical device, the base member may further include active elements which are connected to the pixel electrode, and the wiring lines comprise signal wiring which supply signals to the active elements.

Examples of the active elements include semiconductor elements, such as transistors and two-port elements such as MIMs.

Further, in the above-described electro-optical device, the components are for example, a spin-on-glass film, a diamond film or a fluorinated amorphous carbon film including one of silica glass, alkylsiloxane polymers, alkylsilsesquioxane polymers, hydride alkylsilsesquioxane polymers, and polyaryl ethers.

The components may be porous.

In particular, the components may be composed of aerogel, porous silica, gel containing dispersed microparticles of magnesium fluoride, fluoric polymers, porous polymers, and a predetermined substance containing microparticles.

Further, in the above-described electro-optical device, barrier layers to prevent migration of substances may be provided between the active elements and the components.

When the low-dielectric-constant material is used in the component, since the low-dielectric-constant material is generally porous or has low-density, a substance, such as metal or oxygen, can be easily passed through the member. Thus, the substance that has passed through the member causes some problems, such as deterioration of the active elements or corrosion of wiring lines. In order to address or solve these problems, when the barrier layers are provided between the components and the active elements, migration of substance causing deterioration or corrosion can be avoided.

In the above-described electro-optical device, at least part of the components is preferably covered with a protective film to prevent the migration of substances.

Since substances can easily pass through the component, when at least part of the components is covered with the protective film, dispersion of substances via the components can be avoided. Moreover, deterioration or corrosion of the wiring lines or the active elements in the electro-optical device can be reduced. Generally, since a low-dielectric-constant material is mechanically fragile, advantageously, the protective film can mechanically reinforce the components.

An electronic apparatus of the present invention includes a display device incorporating the electronic device described above.

In an electronic apparatus of the present invention, since the parasitic capacitance is reduced, the display operation has an excellent follow-up property to input signals with high frequency or high speed and is stable.

BRIEF DESCRIPTION OF THE DRAWINGS

FIGS. 4(a) and 4(b) are schematics that show the cross-sectional structure of a pixel region (organic EL device), where FIG. 4(a) shows a top emission type, and FIG. 4(b) shows a back emission type;

FIGS. 5(a) and 5(b) are schematics that show an example of the planar structure of a partition;

FIGS. 7(a)–7(e) are schematics explaining an exemplary embodiment in which a method of making an electro-optical device of the present invention is applied to a process of making a display device including an organic EL element;

FIGS. 8(a)–8(e) are schematics explaining an exemplary embodiment in which a method of making an electro-optical device of the present invention is applied to a process of making a display device including an organic EL element;

FIGS. 9(a)–9(c) are schematics explaining an exemplary embodiment in which a method of making an electro-optical device of the present invention is applied to a process of making a display device including an organic EL element;

FIGS. 14(a) and 14(b) are schematics showing another example of a circuit of an organic EL display device;

DETAILED DESCRIPTION OF PREFERRED EMBODIMENTS

The present invention is described below in detail.

Figure 1:
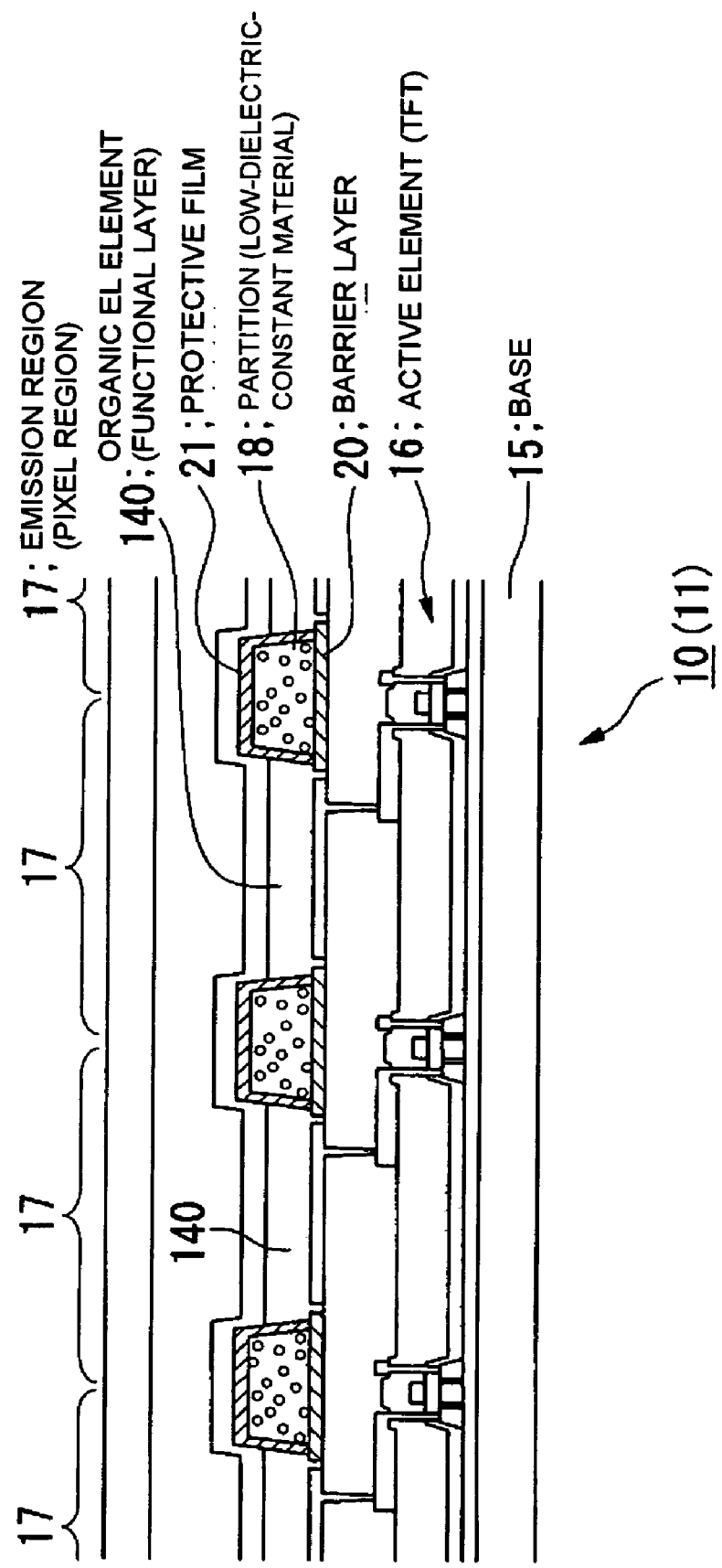
FIG. 1 is a schematic conceptually showing the structures of an electro-optical device and a substrate of the present invention in a cross-section.

FIG. 1 is a schematic that conceptually shows the structures of an electro-optical device and a substrate of the present invention in a cross-section. Reference numeral 10 denotes an electro-optical device, and reference numeral 11 denotes a wiring substrate. The wiring substrate 11 is of a multiplayer interconnection type and includes insulating layers and active elements 16, such as thin film transistors (hereinafter "TFTs"), disposed on the base 15. The electro-optical device 10 includes a plurality of light-emitting regions 17 that contain luminescent layers as the functional films and is disposed on the wiring substrate 11. The state of light emission is controlled by using the active elements 16. At borders between the light-emitting regions 17, partitions (banks) 18 functioning as insulating layers are provided.

The electro-optical device 10 of the present invention is provided such that the partitions 18 are made of a low-dielectric-constant material. When the partitions 18 are composed of the low-dielectric-constant material, the parasitic capacitance between conductive parts, such as wiring lines is decreased.

The dielectric constant (relative dielectric constant) of the low-dielectric-constant material is preferably 4 or less, for example, more preferably, 3 or less, and most preferably 2.5 or less. Particularly, when a low-dielectric-constant material is highly porous, the low-dielectric-constant material can exhibit a low dielectric constant within the above-described ranges.

For example, the partitions 18 are made from a low-dielectric-constant material as follows. First, a layer is formed on the base 15 by any one of various coating methods, chemical vapor deposition (CVD) methods, and the like, and then the low-dielectric-constant layer is patterned into a particular shape by etching, ashing, or the like to form the partitions 18.

Examples of the low-dielectric-constant material include a spin-on-glass film, a diamond film, and a fluoric amorphous carbon film that contain at least one of silica glass, alkylsiloxane polymers, alkylsilsesquioxane polymers, hydride alkylsilsesquioxane polymers, and polyaryl ethers. Other examples of the low-dielectric-constant material include aerogel, porous silica, gel containing dispersed microparticles of magnesium fluoride, fluoric polymers, porous polymers, and a predetermined substance containing microparticles.

Examples of aerogel include silica aerogel and alumina-based aerogel. Silica aerogel is a porous substance of a uniform hyperfine structure obtained by supercritically drying a wet gel produced by a sol-gel reaction of silicon alcoxide. Silica aerogel is 90 volume % or more void, and the balance is $SiO_2$ microparticles of several ten nanometers aggregated into a dendritic structure. The dielectric constant can be controlled by adjusting the porosity.

Silica aerogel is made through a step of preparing the wet gel by a sol-gel method, a step of aging the wet gel, and a supercritical drying step of drying the wet gel by a supercritical drying method. A supercritical drying method removes liquid inside a jelly gel substance comprising a solid phase and a liquid phase by replacing the liquid with supercritical fluid. The method is suitable to dry a gel substance without shrinking the gel. Highly porous aerogel can be prepared according to this method.

The use of the supercritical drying method in forming a spin-on-glass film is recommended. By employing the supercritical drying method, the coating ability and the film quality can be further enhanced.

In forming the partitions 18 with silica aerogel, the wet gel applied on the base by coating is supercritically dried. A synthetic resin (organic material) may be blended into the wet gel. The thermal denaturation temperature of the synthetic resin is higher than the critical temperature of the supercritical fluid. For example, when alcohol is used as the supercritical fluid, examples of synthetic resins the thermal denaturation temperatures of which are higher than the critical temperature of alcohol include hydroxypropylcellulose (HPC), polyvinyl butyral (PVB), and ethylcellulose (EC) (PVB and EC are soluble in alcohol and insoluble in water). When ether is used as the solvent, a chlorine polyethylene or the like is preferably selected as the resin. When $CO_2$ is used as the solvent, HPC or the like is preferably selected as the resin.

Porous silica, i.e., a porous $SiO_2$ film, is prepared by a plasma-enhanced chemical vapor deposition (CVD) process. The reactant gas is $SiH_4$ and $N_2O$. On this $SiO_2$ film, another porous $SiO_2$ film is formed. This $SiO_2$ film is prepared by an atmospheric pressure chemical vapor deposition (CVD) process. The reactant gas contains tetraethoxysilane (TEOS), $O_2$ (oxygen), and a low concentration of $O_3$ (ozone). Here, "the low concentration of $O_3$" means that the concentration of $O_3$ is lower than that required for oxidizing TEOS.

Examples of the fluoric polymers or fluoric-polymer-containing substances include perfluoroalkyl-polyether, perfluoroalkylamine, and films containing perfluoroalkyl-polyethers and perfluoroalkylamine.

Moreover, a mixture of a predetermined polymer binder and a soluble or dispersible fluorocarbon compound may be used.

Examples of the polymer binder include polyvinyl alcohol, polyacrylic acid, polyvinylpyrrolidone, polyvinyl sulfonic acid sodium salt, polyvinyl methyl ether, polyethylene glycol, poly-α-trifluoromethyl acrylic acid, polyvinyl methyl ether-co-maleic anhydride, polyethylene glycol-co-propylene glycol, and polymethacrylic acid.

Examples of the fluorocarbon compound include perfluorooctanoic acid-ammonium salt, perfluorooctanoic acid-tetramethylammonium salt, $C_7$ and $C_{10}$ perfluoroalkylsulfonic acid ammonium salts, $C_7$ and $C_{10}$ perfluoroalkylsulfonic acid tetramethylammonium salts, fluorinated alkyl quaternary ammonium iodide, perfluoroadipic acid, and quaternary ammonium salt of perfluoroadipic acid.

Voids may be formed using microparticles for the low-dielectric-constant material. The voids may be microvoids between the microparticles or inside the microparticles. Inorganic microparticles or organic microparticles may be used as the microparticles. Inorganic microparticles are preferably amorphous. Inorganic microparticles preferably include a metal oxide, nitride, sulfide, or halide. More preferably, inorganic microparticles include metal oxide or metal halide. Most preferably, inorganic microparticles comprise metal oxide or metal fluoride. Preferable metals are Na, K, Mg, Ca, Ba, Al, Zn, Fe, Cu, Ti, Sn, In, W, Y, Sb, Mn, Ga, V, Nb, Ta, Ag, Si, B, Bi, Mo, Ce, Cd, Be, Pb and Ni. Magnesium (Mg), calcium (Ca), boron (B), and silicon (Si) are more preferred. An inorganic compound containing two metals may be used. A particularly preferable organic compound is silicon dioxide, i.e., silica.

Microvoids in inorganic microparticles may be formed, for example, by crosslinking molecules of silica that constitutes the particles. When the molecules of silica are crosslinked, the volume decreases and the particles become porous. Inorganic microparticles having microvoids (porosity) can be directly synthesized as a dispersible substance by a sol-gel method (disclosed in Japanese Unexamined Patent Application Publication No. 53-112732 and Japanese Examined Patent Application Publication No. 57-9051) or by a precipitation method (disclosed in APPLIED OPTICS 27, 3356 (1988)). Alternatively, the dispersible substance may be prepared by mechanically crushing powder obtained by a drying/sedimentation method. Commercially available porous inorganic microparticles, e.g., silicon dioxide sol, may be used. When in use, the inorganic microparticles having microvoids are preferably dispersed in an adequate medium. As the dispersant, water, alcohols (for example, methanol, ethanol, or isopropyl alcohol), and ketones (for example, methyl ethyl ketone or methyl isobutyl ketone) are preferable.

Organic microparticles are preferably also amorphous. Organic microparticles are preferably polymer microparticles synthesized by polymerization of monomers, e.g., an emulsion polymerization method. The polymer of organic microparticles preferably contains fluorine atoms. Examples of the monomers containing fluorine atoms used to synthesize a fluorine polymer include fluoroolefins, such as fluoroethylene, vinylidene fluoride, tetrafluoroethylene, hexafluoropropylene, and perfluoro-2,2-dimethyl-1,3-dioxol; fluorinated alkylesters of acrylic acid or methacrylic acid; and fluorinated vinyl ethers. Alternatively, a copolymer of a fluorine-containing monomer and a fluorine-free monomer may be used. Examples of the fluorine-free monomer include olefins, such as ethylene, propylene, isoprene, vinyl chloride, and vinylidene chloride; acrylic esters, such as methyl acrylate, ethyl acrylate, and 2-ethylhexyl acrylate; methacrylic esters, such as methyl methacrylate, ethyl methacrylate, and butyl methacrylate; styrenes, such as styrene, vinyltoluene, and α-methyl styrene; vinyl ethers such as methyl vinyl ether; vinyl esters, such as vinyl acetate and vinyl propionate; acrylic amides such as N-tert-butylacrylamide and N-cyclohexylacrylamide; methacrylic amides; and acrylnitriles.

The microvoids in the organic microparticles are formed by, for example, crosslinking the polymers that constitute the particles. When the polymers are crosslinked, the volume thereof decreases, and the particles become porous. In order to crosslink the polymers to prepare particles, 20 mol % or more of the monomers to synthesize the polymer are preferably polyfunctional. The amount of the polyfunctional polymers is more preferably 30 to 80 mol %, and most preferably 35 to 50 mol %. Examples of the polyfunctional monomers include dienes, such as butadiene and pentadiene; esters of polyvalent alcohols and acrylic acid, such as ethylene glycol diacrylate, 1,4-cyclohexane diacrylate, and dipentaerythritol hexaacrylate; esters of polyvalent alcohols and methacryl acid, such as ethylene glycol dimethacrylate, 1,2,4-cyclohexane tetramethacrylate, and pentaerythritol tetramethacrylate; divinyl compounds, such as divinylcyclohexane and 1,4-divinylbenzene; divinylsulfone; bisacrylamides, such as methylene bisacrylamide; and bismethacrylamides. The microvoids between the particles are formed by stacking at least two microparticles.

A material having micropores and inorganic microparticles may be used as the low-dielectric-constant material. In such a case, after a layer is formed with the material by coating, activation gas treatment is performed to remove the gas from the layer and to form the micropores.

Moreover, two or more types of ultra fine particles, such as $MgF_2$ and $SiO_2$, may be blended. In such a case, the ultra fine particles are adhered to each other by $SiO_2$ produced by pyrolysis of ethyl silicate. During the pyrolysis of ethyl silicate, carbon dioxide and steam are produced from burning ethyl segments. As carbon dioxide and steam are removed from the layer, gaps are formed between the ultra fine particles.

Alternatively, a layer may be formed by blending an inorganic ultrafine powder comprising porous silica with a binder. Alternatively, two or more microparticles including fluoric polymers may be stacked so as to form a layer having gaps between microparticles.

Alternatively, a substance that can increase the porosity at a molecular level may be used as the low-dielectric-constant material. An example thereof is a polymer, such as a dendrimer, having a branch structure.

Barrier layers 20 to prevent migration of metal are preferably disposed between each partition 18 and each active element 16. Since the partition 18 made of a low-dielectric-constant material is often porous, a substance such as metal can easily pass through the partition. When metal reaches the active element 16 through the partition 18, the active element 16 may be degraded due to a chemical reaction. When the barrier layers 20 are provided between the partition 18 and the active element 16, the deterioration of the active element 16 and degradation of element performance can be prevented.

For example, ceramic, a silicon compound, such as silicon nitride, oxidized silicon nitride, or silicon oxide, and a material having a heat releasing effect, such as aluminum nitride, silicon carbide, silicon nitride, boron nitride, or boron phosphide may be used to form the barrier layers 20. When the barrier layer 20 has a heat releasing effect in addition to the metal blocking effect, the effect of thermal shrinkage of the partition 18 composed of the low-dielectric-constant material can be reduced or minimized.

For example, a material containing one of rare earth elements (for example, at least one selected from cerium, ytterbium, samarium, erbium, yttrium, lanthanum, gadolinium, dysprosium, and neodymium) and nitrogen, silicon, aluminum and oxygen may be used.

Alternatively, a conductive layer composed of titanium nitride, tantalum nitride, or the like may be formed. In making the barrier layers 20 having a conductive property, the thickness and the shape thereof are determined so as not to increase the effective wiring resistance.

The barrier layer composed of the above-described materials is formed by, for example, CVD methods, various coating methods, sputtering methods, vapor deposition methods, and the like. The barrier layer 20 may have a single-layer structure or a multilayer structure.

Preferably, at least part of the partition 18 is covered by a protective film 21 that prevents passage of liquid, gas, or substances such as metal. Since substances can easily enter the partition 18 composed of a low-dielectric-constant material and the like, the low-dielectric constant property of the partition 18 may easily be degraded by entrance of substances during the production process. When at least part of the partition 18 is provided with the protective film 21, the low-dielectric-constant property of the partition 18 can be maintained, and a reduction in capacitance of wiring lines can be reliably achieved. Generally, since a low-dielectric-constant material is mechanically fragile, the protective film 21 also mechanically reinforces the partitions 18. Furthermore, since dispersion of substances via the partition 18 is inhibited, a problem of the substance affecting other regions through the partition 18 can be avoided.

The protective film 21 may be made of ceramic, silicon nitride, oxidized silicon nitride, or silicon oxide, for example. When a film is to be formed at a corner of the partition 18, an inorganic spin-on-glass type material, an organic spin-on-glass type material, a phosphate glass (PSG), highly flexible inorganic or organic polymers, or the like is preferably used.

In making a spin-on-glass type film, the above-described supercritical drying method may be employed. The supercritical drying method further enhances the coating ability and the film quality.

The protective film 21 may be formed by various coating methods, such as spin coating methods, dip coating methods, dispense coating methods, and reflow methods. The protective film 21 may have a single-layer structure or a multilayer structure.

The protective film 21 may be formed instead of the barrier layer 20. In other words, the barrier layer 20 may be omitted when the partition 18, including the face opposing the active element 16, is covered with the protective film 21. In such a case, the protective film 21 may be formed by the above-described material to make the barrier layer 20.

As is described above, the electro-optical device 10 of the present invention includes the partition 18 composed of the low-dielectric-constant material and thus has a reduced parasitic capacitance between conductive parts. Moreover, the operation speed is high. In increasing the operation speed, it is necessary to consider the reduction in wiring resistance as well as parasitic capacitance. A comprehensive designing of the wiring structure is necessary. The wiring substrate 11 of the present invention may use the low-dielectric-constant material in parts other than the partitions.

An active matrix display device using organic EL elements according to another exemplary embodiment of the present invention is described below. The device incorporates the electro-optical device and the wiring substrate of the present invention. In each of the drawings, the scale of layers and components is sometimes altered for the purpose of recognition and explanation.

Figure 2:
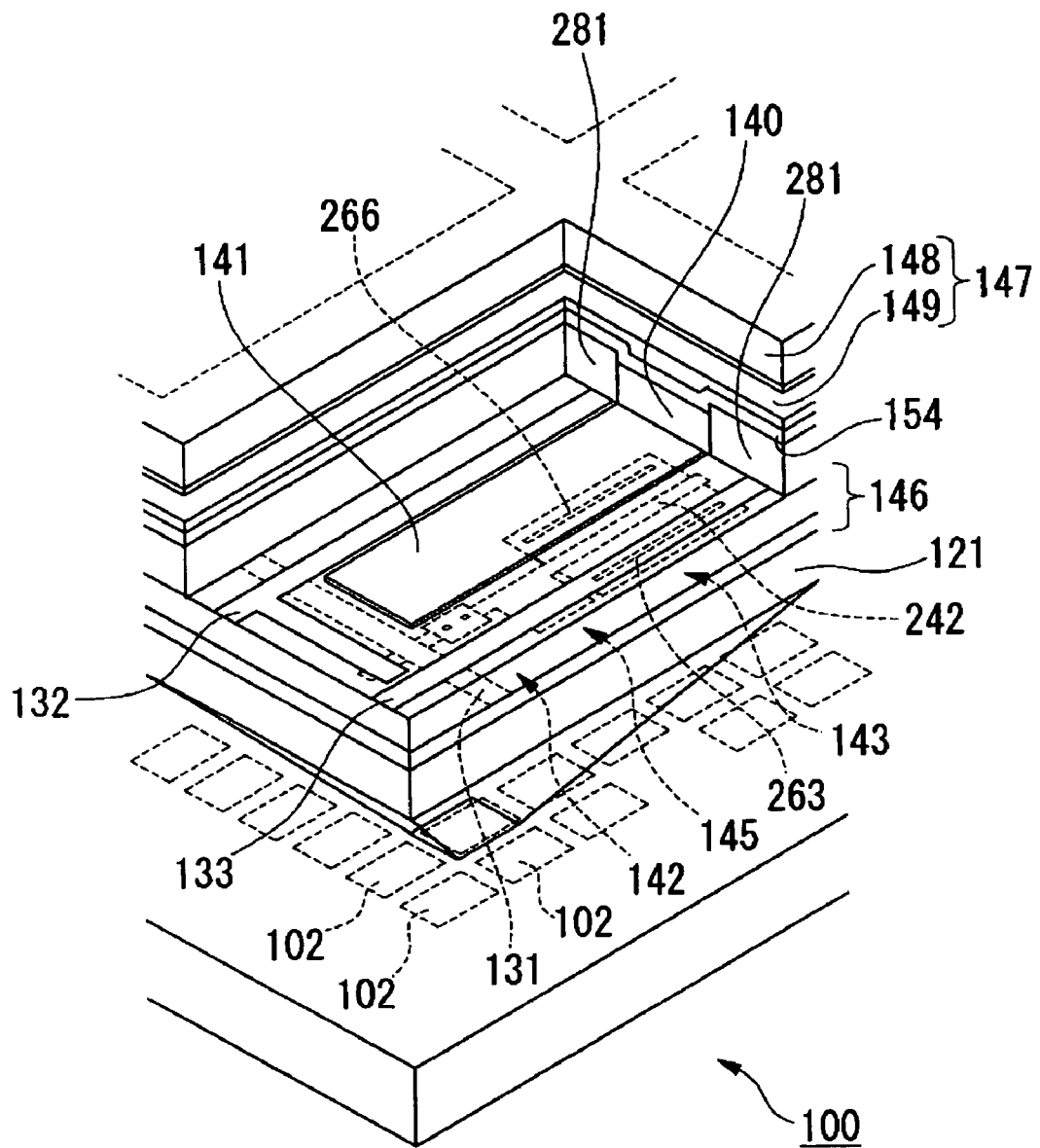
FIG. 2 is a schematic showing the structure of an organic EL display device according to an exemplary embodiment of the present invention.

FIG. 2 is a schematic showing the structure of an organic EL display device according to an exemplary embodiment of the present invention. The organic EL display device 100 is of an active drive type using TFTs as the active elements.

The display device 100 is constituted from an active element unit 146, an organic EL element 140, a cathode 154, and a sealing unit 147 sequentially deposited on a base 121. The active element unit 146 includes TFTs as the active elements. The organic EL element 140 is a functional film comprising a luminescent layer, a hole transport layer, an electron transport layer, and the like.

In this exemplary embodiment, a glass substrate is used as the base 121. Alternatively, a related art or known substrate for use in electro-optical devices and wiring substrates, such as a silicon substrate, a quartz substrate, a ceramic substrate, a metal substrate, a plastic substrate, or a plastic film substrate, may be used.

Pixel regions (luminescent regions) 102 are arranged in a matrix on the base 121. In color display, the pixel regions 102 of, for example, red, green, and blue are arranged in a predetermined pattern.

A pixel electrode 141 is provided to each of the pixel regions 102. A signal line 132, a common feed line 133, a scan line 131, another scan line for pixel electrode (not shown), and the like are disposed in the vicinity of the pixel electrode 141. The shape of the pixel region 102 in a plan view may be rectangular as shown in the drawing, circular, oval, or the like. For example, when the luminescent layer and charge transfer layers, such as electron- and hole-transfer layers, of the organic EL element are prepared by a liquid phase process, such as an inkjet process, the shape is preferably without angular portions, i.e., the shape is preferably circular or oval, in order to uniformly form the above-described layers above the pixel electrode.

The sealing unit 147 blocks water and oxygen to prevent the oxidation of the cathode 154 or the organic EL element 140. The sealing unit 147 includes a sealing resin applied on the base 121 and a sealing substrate (sealing can) 148 bonded to the base 121. For example, a thermosetting resin, a UV curable resin, or the like may be used as the sealing resin. In particular, an epoxy resin, which is a type of a thermosetting resin, is preferably used. The sealing substrate 148 is composed of glass, metal, or the like and is bonded to the base 121 and to the sealing substrate 148 using a sealing adhesive. A desiccant is disposed at the inner side of the base 121. A $N_2$-gas-charged layer 149 charged with $N_2$ gas is disposed between the base 121 and the sealing substrate 148.

Figure 3:
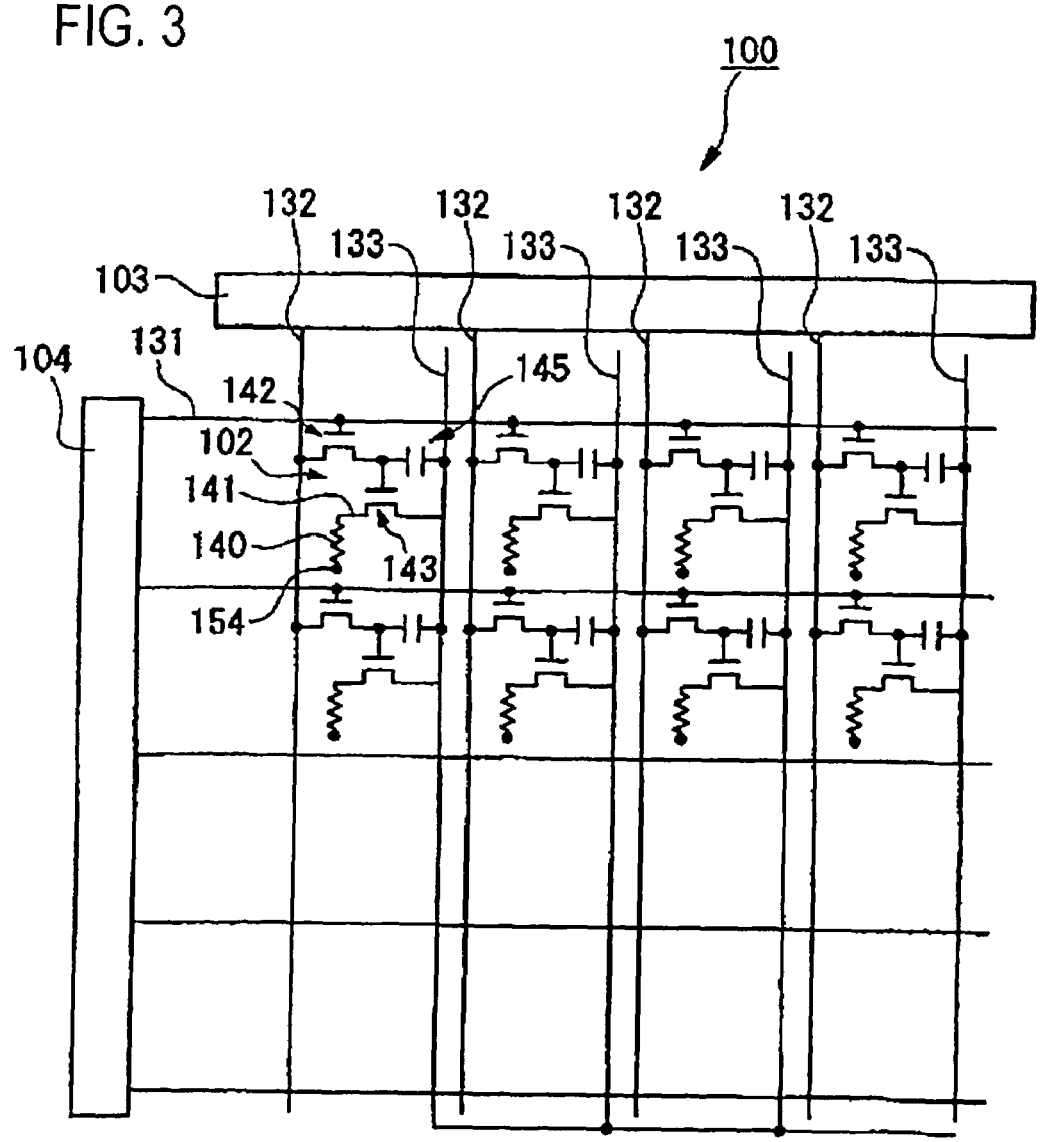
FIG. 3 is a schematic circuit diagram showing an example of a circuit of an active-matrix organic EL display device.

FIG. 3 shows the circuit structure of the display device 100.

As shown in FIG. 3, the scan lines 131, the signal lines 132 orthogonal to the scan lines 131, and the common feed lines 133 parallel to the signal lines 132 are disposed on the base 121. The pixel regions 102 are formed at the intersections of the scan lines 131 and the signal lines 132.

A data drive circuit 103 including, for example, a shift register, a level shifter, a video line, and an analog switch is connected to the signal lines 132. A scan drive circuit 104 comprising a shift register and a level shifter is connected to the scan lines 131.

Each pixel region 102 includes a switching first TFT 142 having a gate electrode to which a scan signal is supplied via the scan line 131; a hold capacitor 145 to hold an image signal supplied from the signal line 132 via the first TFT 142; a second driving TFT 143 having a gate electrode to which the image signal held by the hold capacitor 145 is supplied; a pixel electrode 141 (anode) into which a drive current flows when electrically connected to the common feed line 133 via the driving second TFT 143; and the organic EL element 140 disposed between the pixel electrode 141 and the counter electrode 154 (cathode). The organic EL element 140 is a layer (functional film) comprising an electro-optical material, i.e., an organic electroluminescent material. The organic EL device is constituted from the pixel electrode 141, the cathode 154, the organic EL element 140, and the like.

In the pixel region 102, when the scan line 131 is driven to turn ON the first TFT 142, the potential of the signal line 132 at this time is held by the hold capacitor 145. The state of conduction of the second TFT 143 is determined according to the state of the hold capacitor 145 at this time. A current, the amount of which is determined according to the conduction state of the current TFT, is supplied to the organic EL element 140 from the common feed line 133 via the pixel electrode 141. The emission intensity of the organic EL element 140 is determined according to the amount of the current supplied at this time.

FIGS. 4(*a*) and 4(*b*) schematically show the structure of the pixel region 102 of the organic EL device in a cross-section. FIG. 4(*a*) shows a top-emission type, and FIG. 4(*b*) shows a back-emission type.

In the top-emission organic EL device shown in FIG. 4(*a*), light is emitted from the organic EL element 140 from the side remote from the base 121 provided with the second TFT 143. Thus, the base 121 may be either transparent or opaque.

Examples of the material of the opaque base include ceramics, such as alumina; a metal sheet, such as stainless sheet, subjected to insulating treatment, such as scaling; thermosetting resins; and thermoplastic resins. Preferably, the pixel electrode 141 includes a reflective film such as a metal film. In the present invention shown in FIGS. 4(*a*) and 4(*b*), the pixel electrode 141 is anode and the counter electrode 154 is cathode. However, the anode and the cathode may be interchanged with each other.

In the back-emission organic EL device shown in FIG. 4(*b*), light is emitted from the organic EL element 140 from the base-121-side where the TFT 143 is formed. Thus, the base is either transparent or translucent. Examples of the transparent or translucent base include a glass substrate, a quartz substrate, a resin substrate (plastic substrate or plastic film substrate), and the like. An inexpensive soda glass substrate is particularly suitable. When using the soda glass substrate, it is silica-coated to protect the soda glass vulnerable to acid and alkali and to enhance the flatness of the substrate. A color filter film, a color conversion film containing a luminescent substance, or a dielectric reflective film may be disposed on the base so as to control the wavelength of the emitted light.

Reference numeral 281 denotes a partition (bank) disposed at each border of the pixel regions 102. The partition 281 prevents the materials of the adjacent organic EL elements 140 from becoming mixed with each other during formation of the organic EL elements 140. In the drawing, the partition 281 has a tapered structure in which the top edge is shorter than the bottom edge. Alternatively, a structure in which the top edge is the same or longer than the bottom edge may be employed.

In the back-emission organic EL device, light is emitted from a luminescent layer 286 at the base-121-side provided with the TFT 143. Accordingly, in order to increase the efficiency in light emission, the TFT 143 is preferably disposed below the partition 281 instead of being disposed directly below the organic EL element 140.

FIGS. 5(*a*) and 5(*b*) show examples of the planar structure of the partition 281.

The partition 281 is disposed at the border between the pixel regions 102. Openings corresponding to the arrangement of the pixel regions 102 are provided.

In FIG. 5(*a*), the partitions 281 are arranged to form a grid corresponding to the pixel regions 102 arranged in a matrix. In FIG. 5(*b*), the partitions 281 are arranged in stripes so as to correspond with the pixel regions 102 arranged in stripes. In this exemplary embodiment, the partitions 281 are arranged in a grid in a plan view, as shown in FIG. 5(*a*). The arrangement of the pixel regions 102 and the planar shape of the partitions 281 are not limited by these examples. For example, the pixel regions may be arranged in a so-called delta array in which every other row is displaced and accordingly the planar shape of the partitions 281 may be determined. Moreover, the arrangement of the partitions 281 may be determined according to the shape of the pixel electrode 154 shown in FIG. 2. For example, when the pixel electrode is circular or oval free of angular portions, the partitions 281 may have the corresponding shape free of angular portions.

Figure 6:
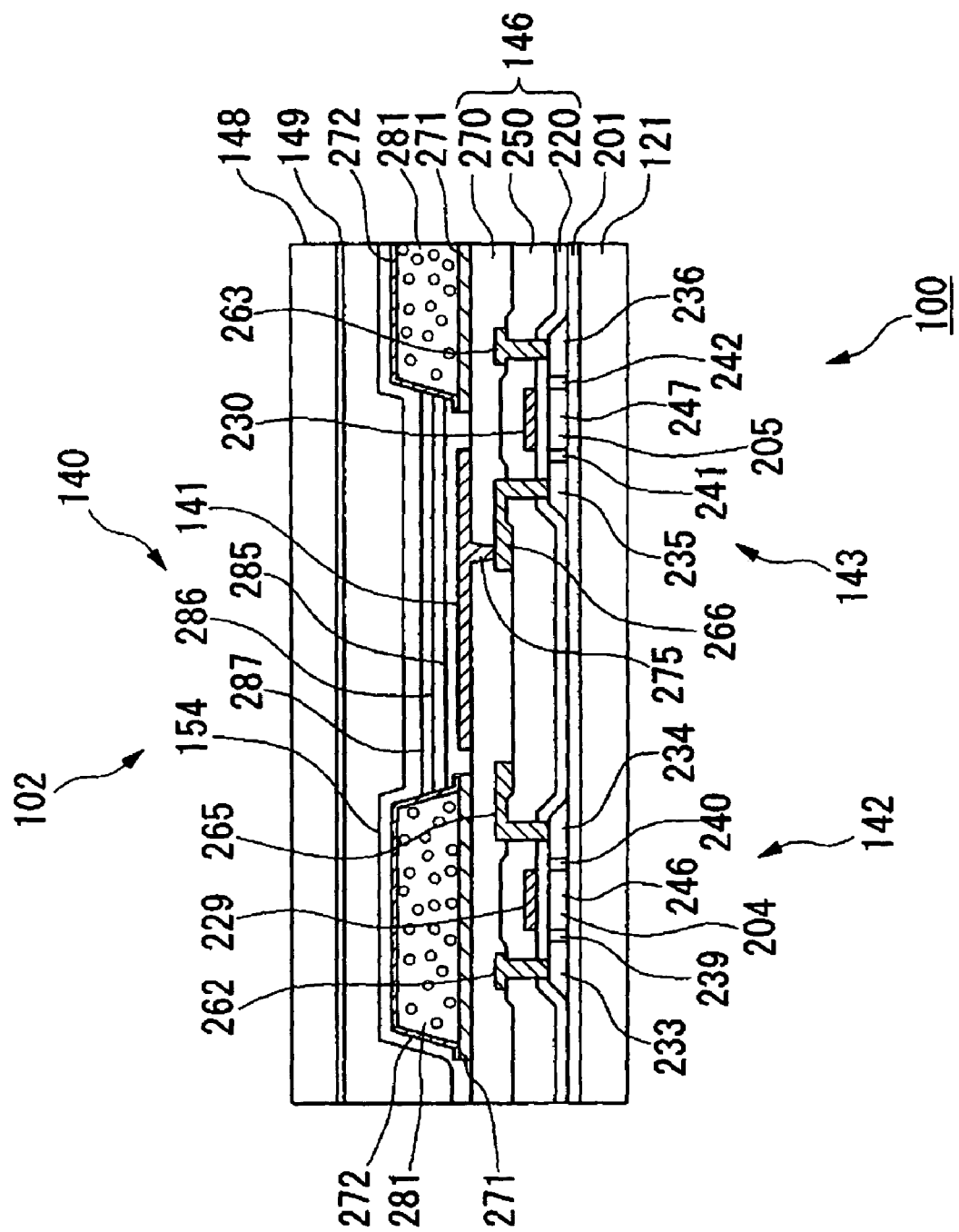
FIG. 6 is an enlarged schematic showing the cross-sectional structure of a top-emission pixel region (organic EL device)
Figure 10:
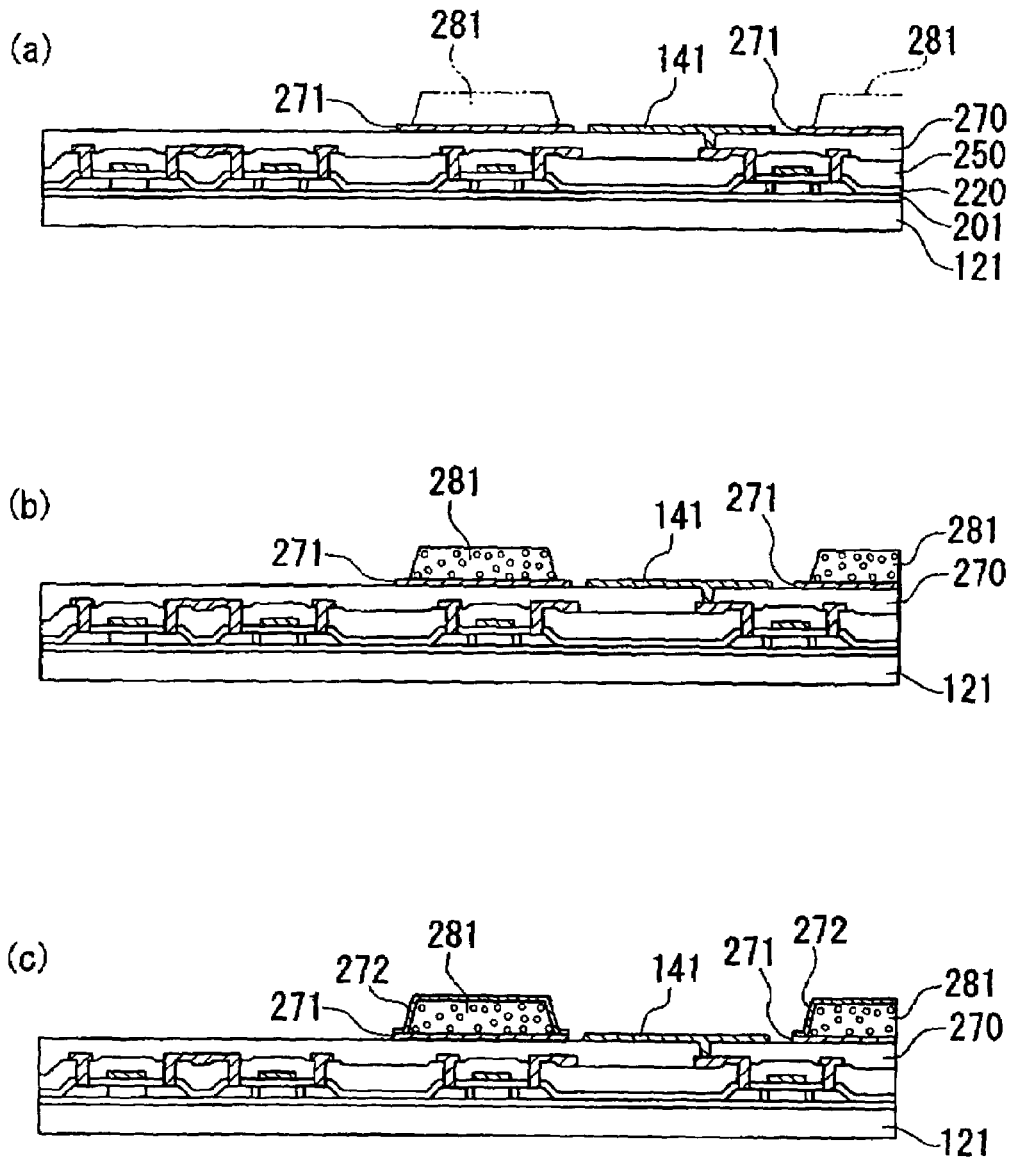
FIGS. 10(a)–10(c) are schematics explaining an exemplary embodiment in which a method of making an electro-optical device of the present invention is applied to a process of making a display device including an organic EL element.
Figure 11:
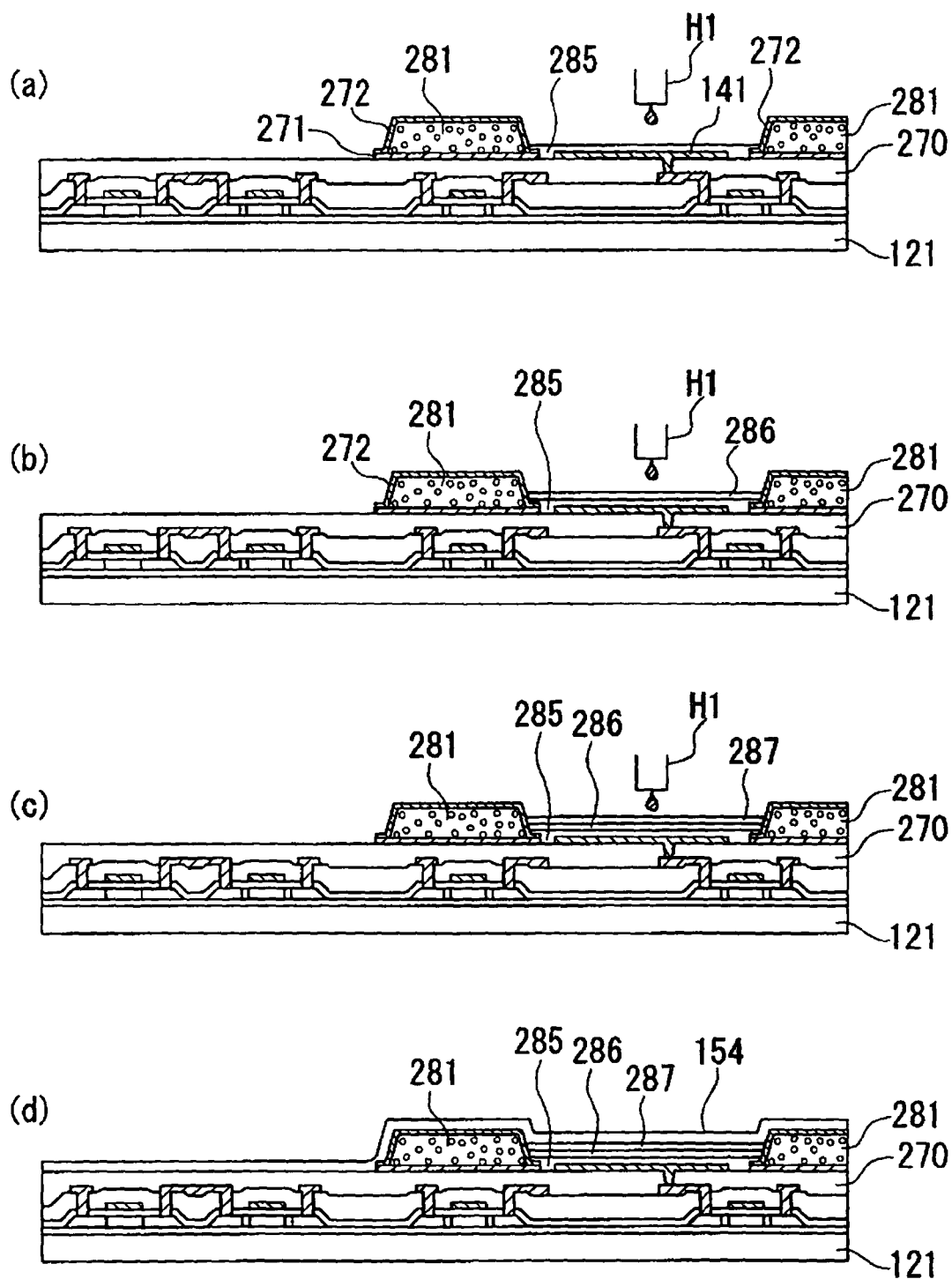
FIGS. 11(a)–11(d) are schematics explaining an exemplary embodiment in which a method of making an electro-optical device of the present invention is applied to a process of making a display device including an organic EL element.

FIG. 6 is an enlarged cross-sectional view of the top-emission organic EL device.

In FIG. 6, the organic EL device comprises the base 121; the pixel electrode 141 (anode) composed of a transparent electrode material, such as indium tin oxide (ITO); a hole transport layer 285 that can transfer holes from the pixel electrode 141; a luminescent layer 286 (organic EL layer) containing an organic EL substance, which is one of electro-optical substances; an electron transport layer 287 formed on the luminescent layer 286; the cathode 154 (counter electrode) formed on the upper face of the electron transport layer 287; and the TFTs 142 and 143 formed on the base 121. The cathode 154 covers the entire surface of the element and injects electrons into the organic EL element 140 in cooperation with the pixel electrode 141. The cathode 154 may have a single-layer structure or a multilayer structure. The cathode 154 may be made of aluminum (Al), magnesium (Mg), gold (Au), silver (Ag), calcium (Ca), lithium fluoride, or the like. These materials may be used alone or in combination. These materials may be used as a composite film including layers composed of each material or may be used as an alloy.

Both the TFTs 142 and 143 are of n-channel type in this embodiment. Alternatively, both or one of the TFTs 142 and 143 may be of p-channel type.

The TFTs 142 and 143 are formed on the base 121 with a base protective film 201 mainly composed of, for example, $SiO_2$ therebetween. The TFTs 142 and 143 include semiconductor films 204 and 205 disposed on the base protective film 201 and composed of silicon or the like; a gate insulating film 220 disposed on the base protective film 201 so as to cover the semiconductor films 204 and 205; gate electrodes 229 and 230 disposed on portions of the upper face of the gate insulating film 220 opposing the semiconductor films 204 and 205; a first interlayer insulating film 250 disposed on the gate insulating film 220 so as to cover the gate electrodes 229 and 230; source electrodes 262 and 263 connecting to the semiconductor films 204 and 205 via contact holes that penetrate through the gate insulating film 220 and the first interlayer insulating film 250; drain electrodes 265 and 266 opposing the source electrodes 262 and 263 with the gate electrodes 229 and 230 therebetween, the drain electrodes 265 and 266 connecting to the semiconductor films 204 and 205 via contact holes penetrating the gate insulating film 220 and the first interlayer insulating film 250; and a second interlayer insulating film 270 disposed over the first interlayer insulating film 250 so as to cover the source electrodes 262 and 263 and the drain electrodes 265 and 266.

In a top-emission structure, the second interlayer insulating film 270 is preferably a planarizing film to prevent diffused reflection of light.

The pixel electrode 141 is disposed on the upper face of the second interlayer insulating film 270. The pixel electrode 141 is connected to the drain electrode 266 via a contact hole 275 in the second interlayer insulating film 270.

When the first interlayer insulating film 250 and the second interlayer insulating film 270 are composed of different materials, the contact hole 275 in the second interlayer insulating film 270 is preferably formed not to overlap the contact hole in the first interlayer insulating film 250.

Sections of the semiconductor films 204 and 205 that overlap the gate electrodes 229 and 230 with the gate insulating film 220 therebetween are channel regions 246 and 247. The semiconductor films 204 and 205 include source regions 233 and 236 disposed at the source side of the channel regions 246 and 247, and drain regions 234 and 235 provided at the drain-side of the channel regions 246 and 247. The source regions 233 and 236 are connected to the source electrodes 262 and 263 via contact holes penetrating the gate insulating film 220 and the first interlayer insulating film 250. The drain regions 234 and 235 are connected to the drain electrodes 265 and 266 via contact holes penetrating the gate insulating film 220 and the first interlayer insulating film 250. The drain electrodes 265 and 266 are composed of the same layer as the source electrode 262 and 263. The pixel electrode 141 is electrically connected to the drain region 235 of the semiconductor film 205 with the drain electrode 266 therebetween.

The partition 281 is formed as a third insulating layer between the cathode 154 and part of the surface of the second interlayer insulating film 270 not occupied by the organic EL device. The partition 281 is composed of a low-dielectric-constant material, such as silica aerogel, as previously described. Since the partition 281 is composed of a low-dielectric-constant material, the parasitic capacitance is low.

Barrier layers 271 are formed between the partition 281 and the second interlayer insulating film 270. The barrier layers 271 are composed of silicon nitride, oxidized silicon nitride, titanium nitride, tantalum nitride, or the like. The barrier layer 271 prevents metal (for example, an alkali metal (movable ion)) that has passed through the partition 281 from entering into the TFTs 142 and 143.

The side faces and the upper face of the partition 281 are covered by a protective film 272 composed of an inorganic polymer, an organic polymer, or the like. The protective film 272 prevents substances, such as liquid, gas, and metal, from entering inside the partition 281. The protective film 272 also prevents dispersion of substances via the partition 281. The extent to which the partition 281 is covered by the protective film 272 is not limited to that shown in the drawing. For example, all faces of the partition 281 may be covered with the protective film 272.

A method for making the electro-optical device according to an exemplary embodiment of the present invention (including a method of making the wiring substrate) is described below with reference to FIGS. 7(a) to 11(d). The method is applied to make a display device incorporating the above-described organic EL device. A process of making the organic EL device including the above-described TFTs 142 and 143 and a process for making TFTs for N-type and P-type drive circuits is explained below.

As shown in FIG. 7(a), the base protective film 201 composed of a silicon oxide film approximately 200 to 500 nm in thickness is formed on the base 121 by a plasma-enhanced CVD method using tetraethoxysilane (TEOS), oxygen gas, or the like, as the raw material, if necessary. Instead of the silicon oxide film, a silicon nitride film or an oxidized silicon nitride film may be used as the base protective film.

Next, the temperature of the base 121 is set at approximately 350° C. and a semiconductor film 200 composed of amorphous silicon approximately 30 to 70 nm in thickness is formed on the surface of base protective film by an ICVD method, a plasma-enhanced CVD method, or the like. The semiconductor film 200 is not limited to the amorphous silicon film. The semiconductor film 200 may be any semiconductor film including an amorphous structure, such as a microcrystalline semiconductor film. Alternatively, the semiconductor film 200 may be a compound semiconductor film, such as an amorphous silicon germanium film, that contains an amorphous structure.

Subsequently, the semiconductor film 200 is subjected to a crystallization step employing a laser annealing method, a rapid heating method (a lamp annealing method or a thermal annealing method), or the like so that the semiconductor film 200 is crystallized into a polysilicon film. In the laser annealing method, for example, an excimer laser with a 400-mm line beam and an output intensity of 200 mJ/cm$^2$ may be employed. A second harmonic wave or a third harmonic wave of a YAG laser may also be used. As for the line beam, the line beam is preferably scanned so that part corresponding to 90% of the peak intensity in the transverse direction is overlapped each region.

Next, as shown in FIG. 7(b), unnecessary portions of the semiconductor film 200 (polysilicon film) are removed by patterning employing photolithography or the like so as to form islands of semiconductor films 202, 203, 204, and 205 corresponding to TFT-formation regions.

Next, the gate insulating film 220 including a silicon oxide film or a silicon nitride film (such as oxidized silicon nitride film) approximately 60 to 150 nm in thickness is formed by a plasma-enhanced CVD method using TEOS, oxygen gas, or the like as the raw material so as to cover the semiconductor film 200. The gate insulating film 220 may have a single-layer structure or a multilayer structure. Methods, such as a thermal oxidation method, other than the plasma-enhanced CVD method may be employed. In making the gate insulating film 220 by a thermal oxidation method, the semiconductor film 200 is crystallized and these semiconductor films can be formed into polysilicon films.

Next, as shown in FIG. 7(c), a conductive film 221 to form gate electrodes is formed over the entire surface of the gate insulating film 220. The conductive film 221 comprises doped silicon, silicide film, or a metal, such as aluminum, tantalum, molybdenum, titanium, or tungsten. The thickness of the conductive film 221 is, for example, approximately 200 nm.

A patterning mask 222 is then formed on the surface of the conductive film 221 to form gate electrodes. As shown in FIG. 7(d), patterning is performed to form a gate electrode 223 at the side where the P-type drive circuit transistor is to be formed. Since the region of the conductive film 221 to form gate electrodes at the side of the N-type pixel electrode transistor and the N-type drive circuit transistor is covered with the patterning mask 222, this region of the conductive film 221 to form gate electrodes is not patterned. The gate electrode may be a single-layer or a multilayer conductive film.

Next, as shown in FIG. 7(e), ions of a p-type impurity (boron in this embodiment) are implanted using, as masks, the gate electrode 223 of a P-type drive circuit transistor and the conductive film 221 to form gate electrodes remaining at the regions where the N-type pixel electrode transistor and the N-type drive circuit transistor are formed. For example, the dose is approximately 1×1015 cm$^{-2}$. As a result, heavily doped source/drain regions 224 and 225 having an impurity concentration of, for example, 1×1020 cm$^{-3}$ are formed in a self aligning manner with respect to the gate electrode 223. The portion not covered by the gate electrode 223 and in which no impurity is introduced becomes a channel region 226.

Referring now to FIG. 8(a), a patterning mask 227 including a resist mask or the like is formed. The patterning mask 227 completely covers the region at the P-type-drive-circuit-transistor side and regions where the N-type pixel electrode TFTs 10 and the gate electrodes of the N-type drive circuit transistor side are to be formed.

Next, as shown in FIG. 8(b), the conductive film 221 to form gate electrodes is patterned using the patterning mask 227 to form gate electrodes 228, 229, and 230 of the N-type pixel electrode transistor and the N-type drive circuit transistor.

Without removing the patterning mask 227, ions of an n-type impurity element (phosphorus in this embodiment) are implanted. The dose is, for example, 1×1015 cm$^{-2}$. As a result, the impurity is introduced in a self-aligning manner with respect to the patterning mask 227, thereby forming heavily doped source/drain regions 231, 232, 233, 234, 235, and 236 inside the semiconductor films 203, 204, and 205. Regions of the semiconductor films 203, 204, and 205 not heavily doped with phosphorus are larger than the regions covered by the gate electrodes 228, 229, and 230. In other words, the semiconductor films 203, 204, and 205 have portions not heavily doped with phosphorus (lightly doped source/drain regions described below) at the two sides of the regions that oppose the gate electrodes 228, 229, and 230, the portions being disposed between the regions that oppose the gate electrodes 228, 229, and 230 and the heavily-doped source/drain regions 231, 232, 233, 234, 235, and 236.

The patterning mask 227 is then removed and ions of an n-type impurity element (phosphorus in this exemplary embodiment) are implanted. The dose is, for example, $1 \times 10^{13}$ cm$^{-2}$.

As a result, as shown in FIG. 8(c), the impurity is introduced into the semiconductor films 203, 204, and 205 at a low concentration in a self-aligning manner with respect to the gate electrodes 228, 229, and 230, thereby forming lightly doped source/drain regions 237, 238, 239, 240, 241, and 242. No impurity is introduced into regions overlapped with the gate electrodes 228, 229, and 230. In these regions formed are the channel regions 245, 246, and 247.

Next, as shown in FIG. 8(d), the first interlayer insulating film 250 is formed to cover the surfaces of the gate electrodes 228, 229, and 230. The first interlayer insulating film 250 is patterned by photolithography or the like so as to form contact holes at predetermined positions for the source electrodes and the drain electrodes. For example, a silicon insulating film such as an oxidized silicon nitride film or a silicon oxide film may be used as the first interlayer insulating film 250. The first interlayer insulating film 250 may have a single-layer structure or a multilayer structure. Subsequently, the semiconductor films are annealed in a hydrogen-containing atmosphere so as to terminate the unpaired bonds with hydrogen (hydrogenation). Plasma-excited hydrogen may be used in the hydrogenation.

Next, a conductive film 251 to form the source and drain electrodes is formed by using a metal film, such as an aluminum film, a chromium film, or a tantalum film. The thickness of the conductive film 251 is, for example, approximately 200 nm to 300 nm. The conductive film may have a single-layer structure or a multilayer structure.

Next, patterning masks 252 are formed at the positions for the source and drain electrodes, and patterning is performed to simultaneously make source electrodes 260, 261, 262, and 263 and drain electrodes 264, 265, and 266, as shown in FIG. 8(e).

Referring to FIG. 9(a), the second interlayer insulating film 270 composed of silicon nitride or the like is formed. The thickness of the second interlayer insulating film 270 is, for example, approximately 1 to 2 μm. A material that transmits light, such as silicon oxide or organic resin, is used to form the second interlayer insulating film 270. Examples of the organic resin include acrylics, polyimides, polyamides, and benzocyclobutenes (BCBs).

As shown in FIG. 9(b), a contact hole 275 extending up to the drain electrode 266 is formed by etching the second interlayer insulating film 270.

Next, as shown in FIG. 9(c), a film composed of a transparent electrode material, such as ITO, fluorine-doped SnO$_2$, ZnO, or polyaniline, is formed, and the contact hole 275 is filled with this film. As a result, the pixel electrode 141 electrically connecting to the source/drain regions 235 and 236 is formed. The pixel electrode 141 functions as the anode of the EL element.

Next, as shown in FIG. 10(a), the barrier layers 271 are formed. The barrier layers 271 are formed at positions where the partitions 281 are to be formed later. These positions are adjacent to the pixel electrode 141 on the second interlayer insulating film 270. The barrier layers 271 can be made of, for example, silicon nitride, oxidized silicon nitride, titanium nitride, or tantalum nitride. The method for forming the barrier layer 271 may be selected properly according to the material used. For example, a CVD method, a coating method, a sputtering method, or a vapor-deposition method may be employed. For example, the barrier layers 271 are formed by depositing a material film over the surfaces of the second interlayer insulating film 270 and the pixel electrode 141 and then patterning the material film by photolithography or the like. An opening corresponding to the position of the pixel electrode 141 is provided between the barrier layers 271. Part of the barrier layer 271 may overlap the edges of the pixel electrode 141.

Next, as shown in 9(b), the partitions 281 are formed on the barrier layer 271 by using a low-dielectric-constant material such as silica aerogel or a porous silica. For example, when silica aerogel is used, as mentioned above, a layer of silica aerogel is formed on the base 121 through the steps of preparing a wet gel by a sol-gel method, aging the wet gel, and supercritically drying the wet gel by a supercritical drying method to obtain aerogel. Subsequently, the aerogel layer is patterned by etching, ashing, or the like so as to make the partitions 281 having a predetermined shape. Preferably, the patterning is performed so that the bottom of each partition 281 is within the barrier layer 271.

Next, as shown in FIG. 10(c), the protective films 272 are formed using a material, such as an inorganic polymer or an organic polymer. Each protective film 272 is formed to cover the upper face and the side faces of the partition 281. The protective film 272 may be formed by applying partially the material only on the partition 281, or by patterning a film formed on all surfaces of the element by photolithography or the like. The protective films 272 mechanically reinforce the partitions 281 and prevent substances from entering inside the partitions 281 in the subsequent steps. When the bottom face of each partition 281 is narrower than the barrier layer 271, entering of substances inside the partition 281 and dispersion of substances through the partition 281 can be effectively prevented since all faces of the partition 281 are covered with the protective film 272 and the barrier layer 271. When a liquid material is provided in the space between the partitions 281 to form the hole transport layer as described below, a material having repellency or affinity to the liquid material may be used in the protective film 272. Alternatively, the protective film 272 may be surface-treated with plasma process or the like so as to provide a desired affinity relative to the liquid material. By controlling the affinity of the protective film relative to the liquid material, the placement of the liquid material can be simplified, and flatness of the film formed by the material may be enhanced.

Next, as shown in FIG. 11(a), the hole transport layer 285 covering the pixel electrode 141 is formed. In making the hole transport layer 285, the raw material is discharged on the pixel electrode 141 by using, for example, an inkjet apparatus as the droplet discharger. Drying and annealing steps are then performed to make the hole transport layer 285 on the pixel electrode 141. For example, when a layer is formed by an inkjet method, a discharge nozzle H1 of an inkjet head is positioned to oppose the pixel electrode 141, and the raw material is discharged from the discharge nozzle H1. The partitions 281 surround the pixel electrode 141. While relatively moving the discharge nozzle H1 and the base 121, droplets of the raw material from the discharge nozzle H1, the amount of one droplet of which is adjusted, are discharged on the pixel electrode 141.

Examples of inkjet discharge techniques include an electrification control method, a pressure oscillation method, an electromechanical conversion method, an electrothermal conversion method, and an electrostatic attraction method. In the electrification control method, charges are provided to the raw material through a charging electrode, and the flying direction of the raw material is controlled by a biasing electrode and thus the raw material is discharged from the nozzle. In the pressure oscillation method, an ultra high pressure of approximately 30 kg/cm$^2$ is applied to the raw material to discharge the raw material from the front end of the nozzle. When no control voltage is applied, the raw material is discharged straight from the nozzle. When a control voltage is applied, electrostatic repulsion is produced in the raw material, and the spread raw material is not discharged from the nozzle. The electromechanical conversion method utilizes the tendency of a piezoelectric element (voltage element) to deform in response to pulsed electric signals. Deformation of the piezoelectric element applies pressure, through a flexible member, to the space where the raw material is stored so as to push out the material in that space and to allow the material to be discharged from the nozzle. In the electrothermal conversion method, a heater inside the space where the raw material is stored is operated to rapidly vaporize the material to form bubbles, and the raw material in the space is discharged by the pressure from the bubbles. In the electrostatic attraction method, a minute pressure is applied to the space where the raw material is stored so as to form a meniscus of the raw material at the nozzle, and the raw material is then taken out by applying electrostatic attraction force. Other methods may also be employed. For example, a method that utilizes a change in viscosity of fluid due to electric fields or a method that utilizes discharge spark may be employed.

When the hole transport layer 285, the luminescent layer 286, and the electron transport layer 287 (described below) are formed by droplet discharging, the surfaces of the pixel electrode 141 and the partition 281 (the surface of the protective film 272) are preferably treated with, for example, plasma so as to render affinity and repellency, respectively, to the liquid.

The step of forming the hole transport layer and the subsequent steps are preferably performed in a water-free oxygen-free atmosphere. For example, an inert gas atmosphere, such as a nitrogen atmosphere, an argon atmosphere, or the like is preferred.

No specific limit is imposed as to the raw material for the hole transport layer 285. Any related art or known substances, such as pyrazoline derivatives, arylamine derivatives, stilbene derivatives, and triphenyldiamine derivatives may be used. In particular, those disclosed in Japanese Unexamined Patent Application Publication Nos. 63-70257, 63-175860, 2-135359, 2-135361, 2-209988, 3-37992, and 3-152184 maybe used. Triphenyldiamine derivatives are preferable. In particular, 4-4'-bis(N(3-methyphenyl)-N-phenylamino)biphenyl is preferred.

Alternatively, a hole injection layer may be formed in addition to or instead of the hole transport layer. Examples of the raw material of the hole injection layer include copper phthalocyanine (CuPc), polyphenylenevinylene, i.e., poly-tetrahydrothiophenylphenylene, 1,1-bis-(4-N,N-ditolylaminophenyl)cyclohexane, and tris-(8-hydroxyquinolinol)aluminum. In particular, copper phthalocyanine (CuPc) is preferably used. When both the hole injection layer and the hole transport layer are formed, for example, the hole injection layer is preferably formed at the pixel-electrode-side prior the formation of the hole transport layer, and the hole transport layer is then preferably formed thereon. When both the hole injection layer and the hole transport layer are provided, an increase in the driving voltage can be controlled, and the drive lifetime (half life) can be extended.

Next, as shown in FIG. 11(b), the luminescent layer 286 is formed on the hole transport layer 285. In the step of forming the luminescent layer 286, the raw material is discharged onto the pixel electrode 141 using, for example, an inkjet apparatus as the droplet discharger, as in the step of making the hole transport layer 285. Drying and annealing are performed to form the luminescent layer 286 on the pixel electrode 141. To form color display, the luminescent layer 286 of blue, red, and green are arranged in a predetermined pattern.

No limit is imposed as to the raw material of the luminescent layer 286. Low-molecular organic luminescent dyes and high-molecular luminescent materials, i.e., luminescent materials comprising various fluorescent substances and phosphorescent materials, may be used. Among conjugated system high molecules, which are emissive substances, those containing an arylenevinylene structure are particularly preferable. Dyes, such as naphthalene derivatives, anthracene derivatives, perylene derivatives, polymethines, xanthenes, coumarins, and cyanines, 8-hydroquinoline and metal complexes of derivatives of 8-hydroquinoline, aromatic amines, tetraphenylcyclopentadiene derivatives, and those disclosed in Japanese Unexamined Patent Application Publication Nos. 57-51781 and 59-194393 may be used as the low-molecular fluorescent substance.

Next, as shown in FIG. 11(c), the electron transport layer 287 is formed on the luminescent layer 286. As in the step of making the hole transport layer 285 and the luminescent layer 286, the electron transport layer 287 is made by discharging the raw material onto the pixel electrode 141 using, for example, an inkjet apparatus as the droplet discharger. Subsequently, drying and annealing are performed to form the electron transport layer 287 on the pixel electrode 141.

No limit is imposed on the raw material of the electron transport layer 287. Examples include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and 8-hydroxyquinoline and metal complexes of derivatives thereof. In particular, as with the raw material to make the hole transport layer, those disclosed in Japanese Unexamined Patent Application Publication Nos. 63-70257, 63-175860, 2-135359, 2-135361, 2-209988, 3-37992, and 3-152184 may be used. In particular, 2-(4-biphenyl)-5-(4-t-butylphenyl)-1,3,4-oxadiazole, benzoquinone, anthraquinone, and tris(8-quinolinol)aluminum are preferred.

The raw material of the hole transport layer 285 or the electron transport layer 287 may be blended into the raw material of the luminescent layer 286, and the mixture may be used as the raw material to form the luminescent layer. In such a case, the amount of the raw material of the hole transport layer or the electron transport layer is properly adjusted according to the type of compound used within the range that does not inhibit film-making ability and emissive characteristics. Generally, the amount is 1 to 40 weight %, and more preferably 2 to 30 weight % of the raw material for the luminescent layer.

Next, as shown in FIG. 11(d), the cathode 154 (counter electrode) is formed over the entire surface of the base 121 or into a striped pattern. The cathode 154 may be single layer composed of Al, Mg, Li, Ca, or the like or may be a multilayer composite film. Alternatively, the cathode 154 may be a single layer composed of an alloy such as Mg:Ag (10:1 alloy) or may be a multilayer composite including the alloy layer. An example of the multilayer composite film is $LiO_2$ (approximately 0.5 nm)/Al or LiF (approximately 0.5 nm)/Al, $MgF_2$/Al. The region close to the luminescent layer is preferably composed of a material having a small work function. For example, Ca, Ba, or the like may be used. With some materials, it is preferable to form a thin layer of LiF or the like at the bottom. A material having a work function higher than that of the lower portion may be used in the upper region close to the seal. An example thereof is Al.

The cathode 154 is preferably formed by a vapor deposition method, a sputtering method, or a CVD method, for example. Vapor deposition is particularly preferred since damage inflicted by heat to the luminescent layer 286 can be avoided.

The upper portion of the cathode 154 is preferably an Al film, an Ag film, or the like formed by a vapor-deposition method, a sputtering method, a CVD method or the like. The thickness thereof is preferably in the range of 100 to 1,000 nm, and more preferably 200 to 500 nm, for example. A protective layer of $SiO_2$, SiN, or the like for preventing oxidation may be provided on the cathode 154.

The organic EL device, and the N-type and P-type drive circuit TFTs are fabricated through the above-described steps.

Subsequently, the base 121 with the organic EL device and the sealing substrate 148 (refer to FIG. 6) are sealed with a sealing resin. The sealing step is preferably performed in an inert gas atmosphere such as nitrogen, argon, helium, or the like. If the step is performed in air, water, oxygen and the like may enter and oxidize the cathode 154 in case that the cathode 154 may have failures such as pinholes and the like, which is problem.

The cathode 154 is then connected to the wiring line of the base 121, and the wiring line of the circuit element unit 146 (refer to FIG. 6) are connected to a driver IC (drive circuit) disposed on or outside the base 121 to form the display device 100 of this exemplary embodiment.

Figure 12:
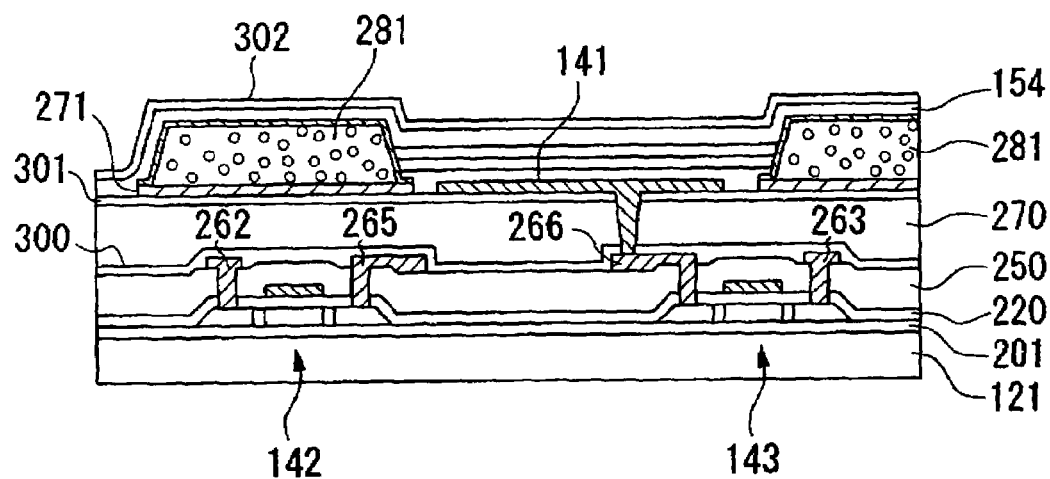
FIG. 12 is a schematic showing another exemplary embodiment of an organic EL device.

FIG. 12 shows another exemplary embodiment of the organic EL device.

The organic EL device shown in FIG. 12 differs from the above-described exemplary embodiment in that a sealing layer (at least one of a first sealing layer 300, a second sealing layer 301, and a third sealing layer 302) to block gas and metal ions is provided.

The first sealing layer 300 is disposed between the first interlayer insulating film 250 and the second interlayer insulating film 270 and covers the source electrodes 262 and 263 and the drain electrodes 265 and 266. The thickness is, for example, 50 to 500 nm. The material for the first sealing layer 300 is, for example, ceramic, silicon nitride, oxidized silicon nitride, silicon oxide, or the like. The first sealing layer 300 protects the TFTs 142 and 143 from water and alkali metal (sodium) from the luminescent layer 286 (EL layer) and the like.

A material having a heat-releasing property in addition to an alkali-metal blocking property may be used to form the first sealing layer 300. An example of such materials is an insulating film containing at least one element selected from boron (B), carbon (C), and nitrogen (N) and at least one element selected from aluminum (Al), silicon (Si), and phosphorus (P). For example, aluminum nitride, silicon carbide, silicon nitride, boron nitride, boron phosphide, or the like may be used. Moreover, an insulating film containing Si, Al, N, O, M, wherein M is at least one of rare earth elements, and more preferably at least one of cerium (Ce), ytterbium (Yb), samarium (Sm), erbium (Er), yttrium (Y), lanthanum (La), gadolinium (Gd), dysprosium (Dy), and neodymium (Nd), may be used.

The second sealing layer 301 is disposed between the second interlayer insulating film 270 and the pixel electrode 141 and has a thickness of, for example, 50 to 500 nm. The material for the second sealing layer 301 is, for example, ceramic, silicon nitride, oxidized silicon nitride, silicon oxide, or the like. The second sealing layer 301 protects the TFTs 142 and 143 from water and alkali metal (sodium) from the luminescent layer 286 (EL layer) and the like.

The material that is the same as the first sealing layer may be used to form the second sealing layer 301. Moreover, the material may have heat-releasing property in addition to the alkali-metal blocking property.

The above-described barrier layer 271 is not necessarily provided when the second sealing layer 301 is provided.

The third sealing layer 302 covers the cathode 154 and has a thickness of, for example, 50 to 500 nm. The third sealing layer 302 may be made of ceramic, silicon nitride, oxidized silicon nitride, silicon oxide, or the like. The third sealing layer 302 prevents water outside from entering. The same material as the above-described first sealing layer may be used to form the third sealing layer 302. The material may have a heat-releasing property in addition to the alkali-metal blocking effect. The organic EL device shown in FIG. 12 is of a top-emission type; the third sealing layer 302 is preferably composed of a material and a thickness that can satisfactorily transmit light.

A low-refractive-index layer may be formed instead of or in addition to these sealing layers to enhance the light output efficiency. The low-refractive-index layer has a light-transmission-refractive index lower than that of the base 121 and is composed of, for example, silica aerogel described above.

The refractive indices of glass and quartz constituting the base 121 are 1.54 and 1.45, respectively. Other material, such as porous $SiO_2$ film or polymers, may be used to form the low-refractive-index layer. A desiccant or a chemical absorbent may be dispersed into the material of the low-refractive-index layer to provide a sealing property to the low-refractive-index layer.

Figure 13:
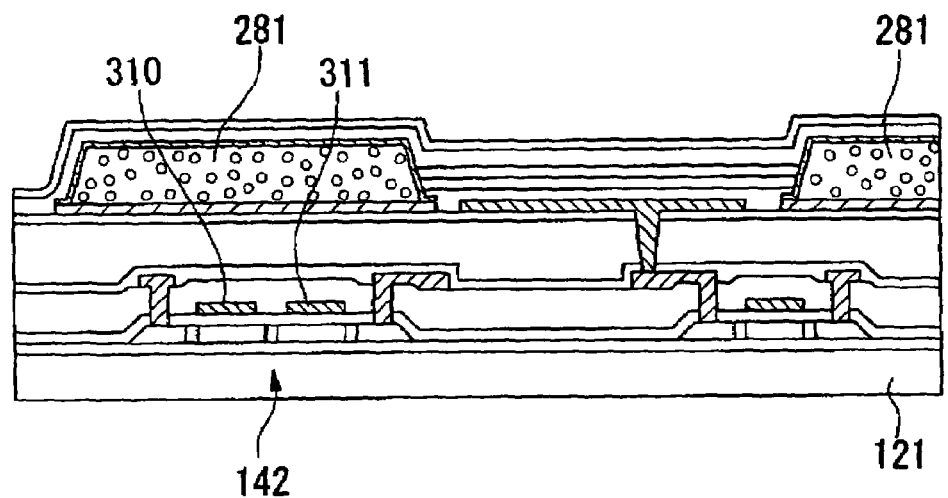
FIG. 13 is a schematic showing another exemplary embodiment of an organic EL device.

FIG. 13 shows another exemplary embodiment of an organic EL device.

Whereas the TFT 142 to switch has a so-called single-gate structure in each of the above exemplary embodiments, the present invention is not limited to this structure. That is, as shown in FIG. 13, a double-gate structure in which two gate electrodes 310 and 311 are electrically connected to each other with gate lines (not shown in the drawing) may be employed. Other multi-gate structures, i.e., structures comprising semiconductor films having two or more channel regions connected in series, such as a triple-gate structure, may be employed. Multi-gate structures have advantages of a reduced OFF-state current and adaptability to large screens.

FIGS. 14(a) and 14(b) show another example of the circuit of the organic EL display device.

The circuit shown in FIGS. 14(a) and 14(b) is of a current-program type in which electrification of the EL element is controlled by adjusting electric current. In FIG. 14(a), a so-called current-mirror circuit is employed. These circuits can maintain the electrification state of the EL element at a constant level and allow stable light emission for the EL layer. Moreover, they are advantageous in fabricating a large-screen display device.

When a high-molecular luminescent material is used to form the luminescent layer, high molecules having emissive groups in side chains may be used. Preferably, high molecules containing conjugated structures in main chains are used. In particular, polythiophene, poly-p-phenylene, polyarylenevinylene, polyfluoroethylene, and their derivatives are preferred. Polyarylenevinylene and its derivatives are most preferred. A polymer containing a repeating unit represented by chemical formula (1) below in an amount of at least 50 mol % of the whole repeating units is preferably used as the polyarylenevinylene and its derivatives. The amount of the repeating unit represented by chemical formula (1) is more preferably at least 70 mol % of the whole repeating units.

—Ar—CR=CR'— (1)

[where Ar represents an arylene group or a heterocyclic compound group, R and R' each independently represent a group selected from hydrogen, $C_1$–$C_{20}$ organic groups, a perfluoroalkyl group, and a cyano group.]

The high-molecular luminescent material may contain an aromatic compound group or a derivative thereof, a heterocyclic compound group or a derivative thereof, or a group combining these groups in addition to the repeating unit represented by formula (1). Moreover, the repeating unit represented by formula (1) or other repeating units may be connected by nonconjugated units, such as those having an ether group, an ester group, an amide group, an imide group, or the like. The repeating units may contain nonconjugated portions of these units.

Examples of polyarylenevinylenes include PPV derivatives, such as poly(para-phenylenevinylene) (PPV), poly (2,5-dimethoxy-1,4-phenylenevinylene) (MO-PPV), poly(2, 5-bishexyloxy-1,4-phenylene-(1-cyanovinylene)) (CN-PPV), and poly [2-methoxy-5-(2'-ethylhexyloxy)]-para-phenylenevinylene (MEH-PPV) represented by formula (2) below.

[Chemical Formula 1]

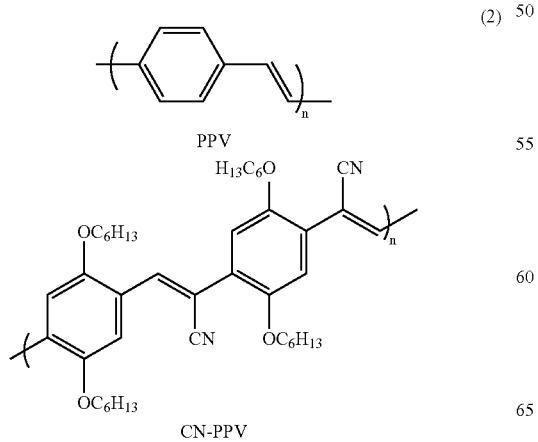

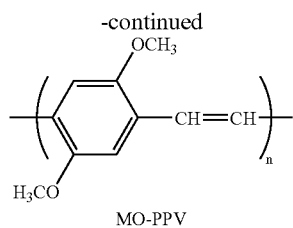

MO-PPV

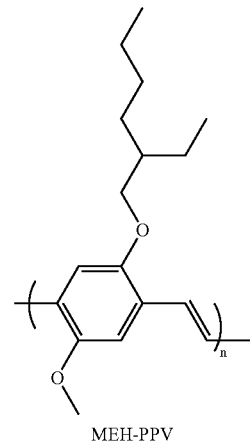

MEH-PPV

Other than the materials described above, poly(paraphenylene), polyalkylfluorene, or the like, for example, may be used. In particular, polyalkylfluorene represented by formula (3) (a polyalkylfluorene copolymer represented by formula (4), for example) is preferred.

[Chemical Formula 2]

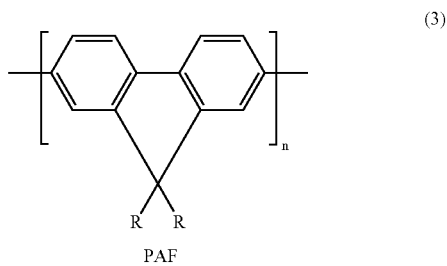

PAF

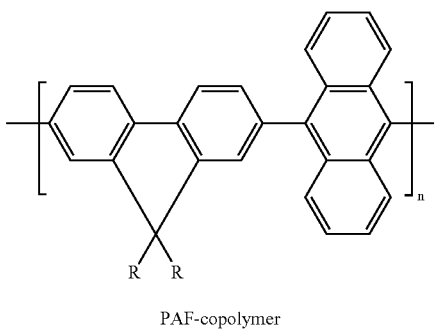

PAF-copolymer

[Chemical Formula 3]

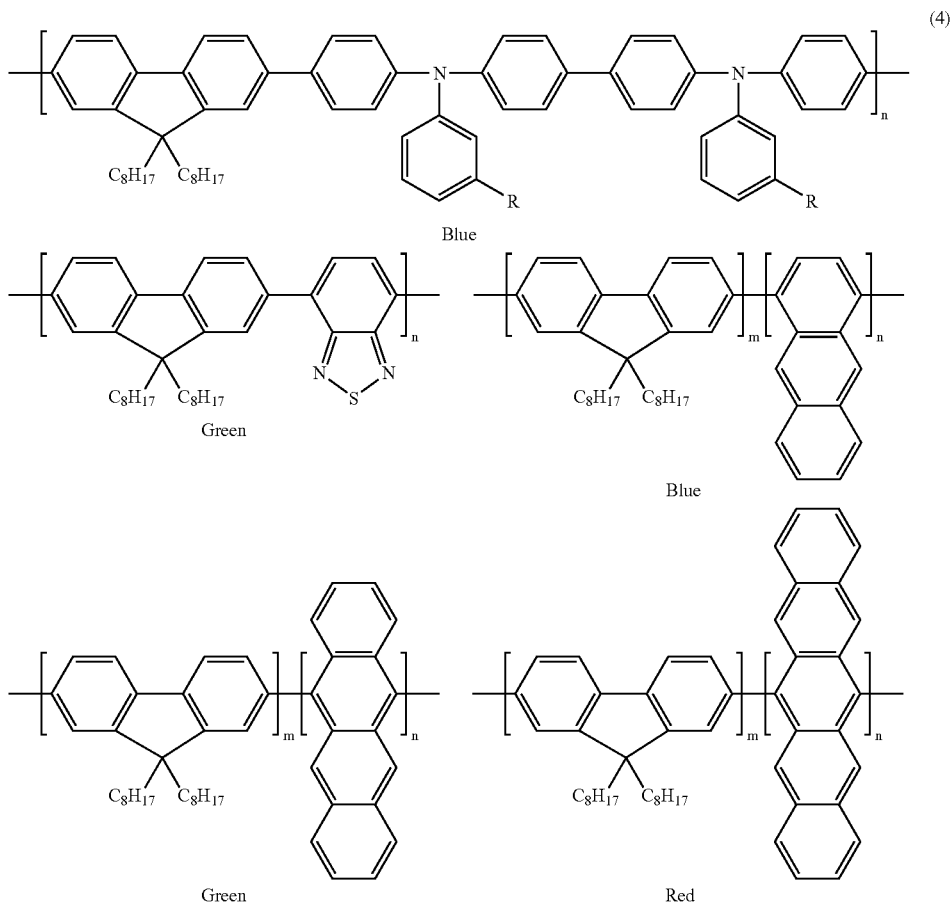

The high-molecular luminescent material may be a random, block, or graft copolymer. High molecules having combined structures, such as a block random copolymer may also be used. From the viewpoint of obtaining a high-molecular luminescent material having a high quantum yield, a block random copolymer, a block copolymer, or a graft copolymer is preferred over completely random copolymers. Since the organic EL device utilizes light emission from thin films, a high-molecular luminescent material having a superior emission quantum yield in the solid state is employed.

Among the above-described materials, those which are liquid at the temperature to form the luminescent layer or those which are highly soluble in a predetermined solvent may be used to form the luminescent layer from the liquid material by an inkjet method or the like. Examples of the solvent include chloroform, methylene chloride, dichloroethane, tetrahydrofuran, toluene, and xylene. Generally, 0.1 wt % or more of the material is dissolvable in these solvents, although this depends on the structure and molecular weight of the high-molecular luminescent material.

The molecular weight of the high-molecular luminescent material is sometimes preferably $10^3$ to $10^7$ on a polystyrene basis. Alternatively, oligomers having a molecular weight of $10^3$ or less may be used.

A synthetic method suitable for the high-molecular luminescent material may be employed to make a desired high-molecular luminescent material. An example is the Wittig reaction between a dialdehyde compound containing two aldehyde groups bonded to an arylene group and diphosphonium salt obtained from triphenylphosphine and a compound containing two halogenated methyl groups bonded to an arylene group. Another synthetic method is dehydrohalogenation method from a compound containing two halogenated methyl groups bonded to an arylene group. Yet another synthetic method is a sulfonium salt decomposition method by which an intermediate obtained by polymerization of sulfonium salt of a compound containing two halogenated methyl groups bonded to an arylene group with an alkali is thermally decomposed to obtain the high-molecular luminescent material.

A method of synthesizing an arylenevinylene copolymer, i.e., an example of the high-molecular luminescent material, will now be specifically described. For example, in making high-molecular luminescent material through the Wittig reaction, a bis(halogenated methyl) compound, more specifically, e.g., 2,5-dioctyloxy-p-xylylene dibromide, is allowed to react with triphenylphosphine in a N,N-dimethylformamide solvent to prepare a phosphonium salt. The resulting phosphonium salt and a dialdehyde compound, for example, terephthalaldehyde, are allowed to undergo the Wittig reaction by which they are condensed in ethyl alcohol using lithium ethoxide, for example. As a result, a high-molecular luminescent material containing a phenylenevinylene group and a 2,5-dioctyloxy-p-phenylenevinylene group is produced. During the process, two or more types of diphosphonium salts and/or two or more types of dialdehyde compounds may be allowed to react in order to prepare the copolymer.

[Chemical Formula 4]

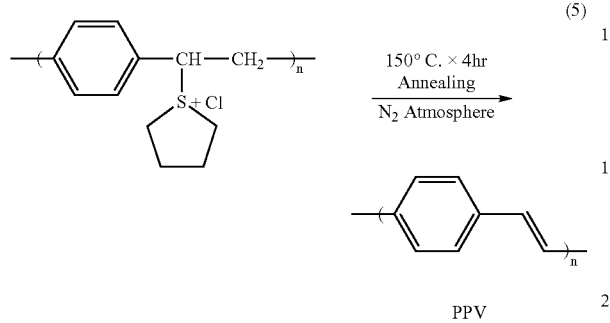

(5)

When using these high-molecular luminescent materials to form the luminescent layer, the purity thereof affects the emissive properties. Thus, it is preferable to perform a refining process, such as reprecipitation or classification by chromatography, on the synthesized material.

In some cases, the luminescent layer may be prepared by annealing and hardening an applied precursor of a low-soluble high-molecular material, as shown by formula (5). For example, when polyphenylene-vinylene is used as the high-molecular luminescent material for making the luminescent layer, a sulfonium salt of a corresponding precursor is disposed at the position of the luminescent layer and is then annealed to eliminate sulfonium groups. As a result, polyphenylene-vinylene functioning as the luminescent layer is obtained.

Basically, any substance that emits light in the visible range can be used as the low-molecular material for making the luminescent layer. Among them, a substance having an aromatic substituent is preferable. Examples thereof include related art or known substances, such as an aluminum quinolinol complex ($Alq_3$), distyrylbiphenyl, $BeBq_2$, and $Zn(OXZ)_2$ represented by formula (6); pyrazoline dimer; quinolidine carboxylic acid; benzopyrylium perchlorate; benzopyranoquinolizine; rubrene; and a phenanthroline europium complex.

Suitable materials that emit blue, green, and red light may be selected from the above-described high-molecular and low-molecular materials and may be arranged at predetermined positions to provide color display. A mask vapor-deposition method, a printing method, an inkjet method, or the like may be used to arrange the materials at predetermined positions.

[Chemical Formula 5]

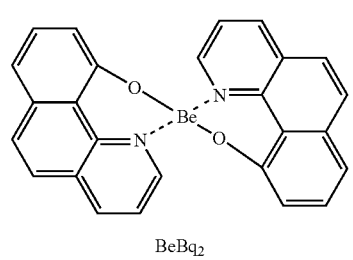

(6)

BeBq$_2$

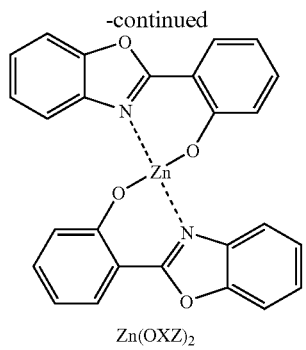

Zn(OXZ)$_2$

The luminescent layer may be a so-called host/guest luminescent layer in which host is dispersed into a guest functioning as a medium.

In the host/guest luminescent layer, the guest material basically determines the color of light emitted from the luminescent layer. Thus, selection of the guest material is made according to the desired color. Generally, a material that can efficiently emit florescent light is selected. A material that has an energy level higher than the excited level related to the emission of the guest material is preferable as the host material. Sometimes, the material is required to have high carrier mobility. In such cases, the material may be selected from the above-described high-molecular luminescent materials.

Examples of the guest material that emits blue light include coronenes and distyrylbiphenyls. Examples of the guest material that emits green light include quinacridones and rubrenes. Examples of the guest material that emits red light include florescent dyes, such as rhodamines.

The host material may be selected to suit the guest material. For example, $Zn(OXZ)_2$ and coronene may be used as the host material and the guest material, respectively, to form a luminescent layer that emits blue light.

A phosphorescent material may also be used as the guest material. For example, Ir(ppy)$_3$, Pt(thpy)$_2$, or PtOEP represented by formula (7) may be suitably used.

[Chemical Formula 6]

(7)

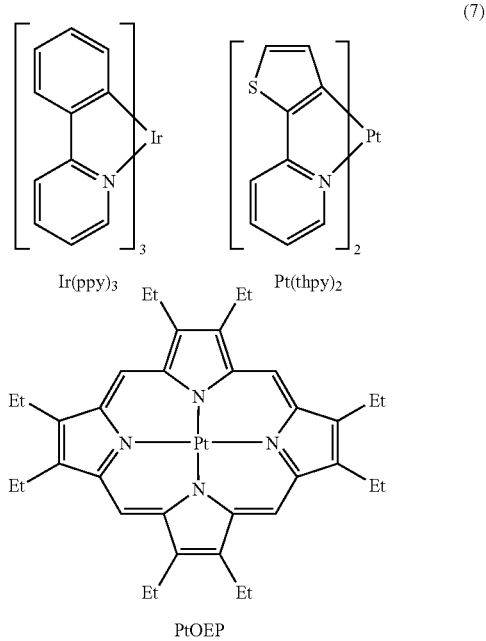

Ir(ppy)$_3$    Pt(thpy)$_2$

PtOEP

When the phosphorescent material shown in formula (7) is used as the guest material, preferable examples of the host material include CBP, DCTA, and TCPB represented by formula (8) and Alq$_3$.

The host/guest luminescent layer is formed by codeposition, application liquidfied host material, guest material, or the precursors thereof, or the like.

[Chemical Formula 7]

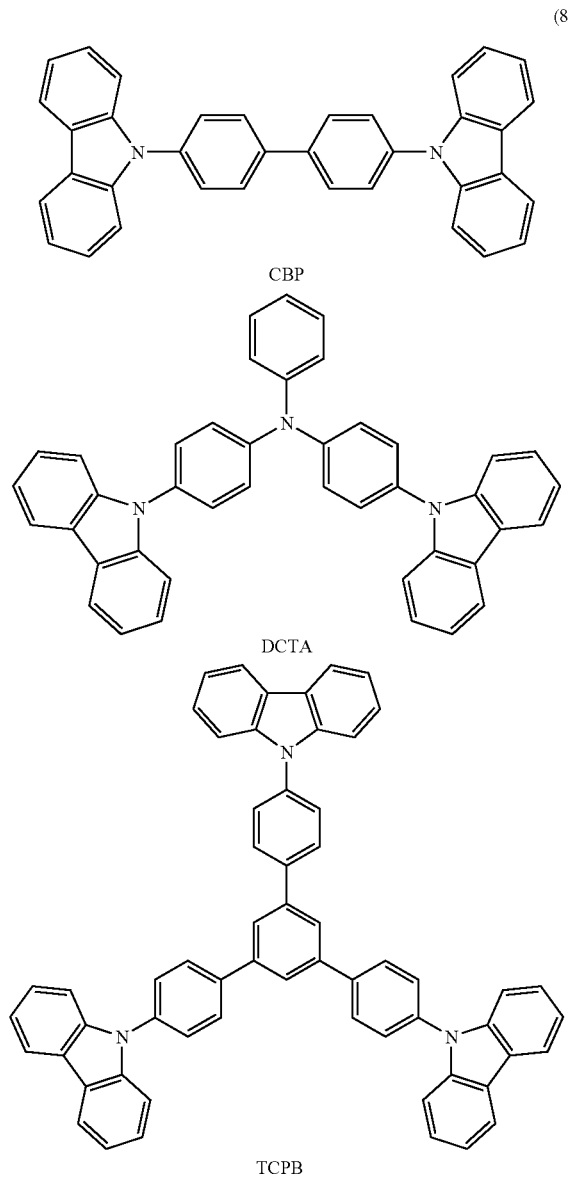

[Chemical Formula 8]

the luminescent layer, and the electron transport layer. The hole blocking layer may be disposed, for example, at the counter-electrode-side of the luminescent layer so as to extend the lifetime of the luminescent layer. Examples of the material of the hole blocking layer include, for example, BCP represented by formula (9) and BAlq represented by formula (10). However, BAlq is preferable from the viewpoint of extending the lifetime.

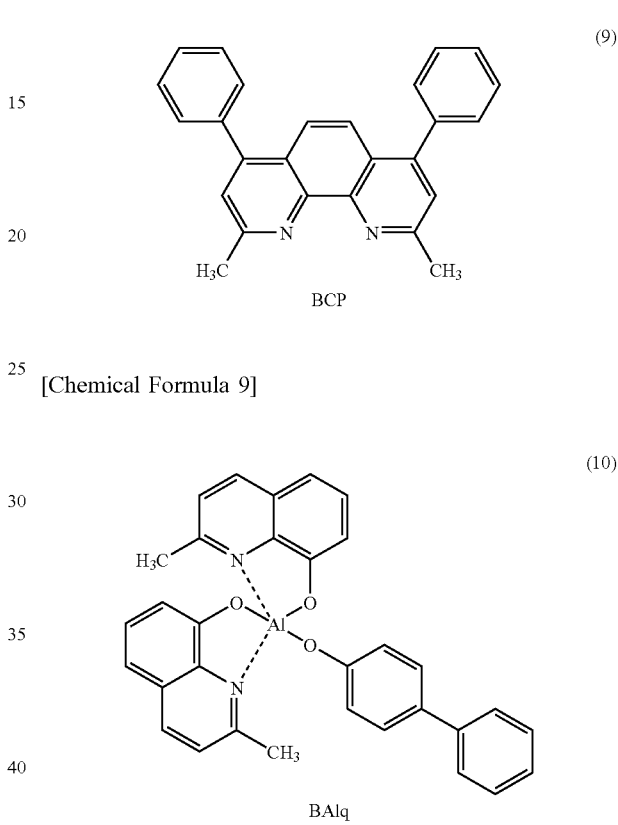

In the above-described embodiment, the hole transport layer is disposed below the luminescent layer and the electron transport layer is disposed above the luminescent layer. This does not limit the structure of the present invention. For example, only one of the hole transport layer and the electron transport layer may be formed. A hole injection layer may be formed instead of the hole transport layer. Only the luminescent layer may be formed.

Alternatively, a hole blocking layer may be formed in addition to the hole injection layer, the hole transport layer, It is apparent that the electro-optical device produced as in the above can be driven by either an active method or a passive method.

FIGS. 15 to 20 show exemplary embodiments of electronic apparatuses according to the present invention.

The electronic apparatuses of these exemplary embodiments have a display device incorporating the electro-optical apparatuses of the present invention, such as the above-described organic EL display devices.

Figure 15:
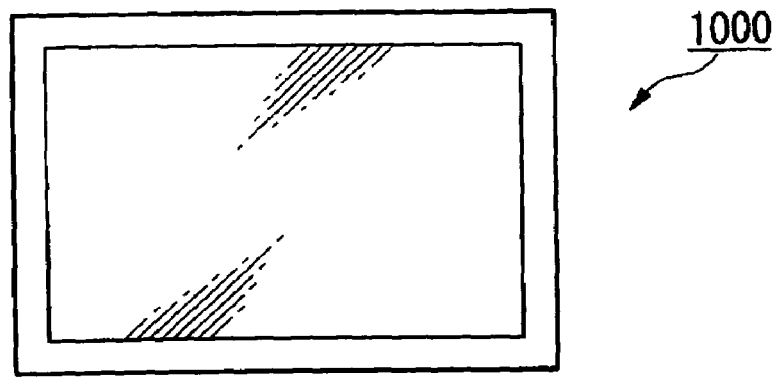
FIG. 15 is a schematic showing an exemplary embodiment of an electronic apparatus according to the present invention.

FIG. 15 shows an example of the display device to display television images or characters and images transmitted from a computer. In FIG. 15, reference numeral 1000 denotes a display main unit incorporating the electro-optical device of the present invention. The display main unit 1000 using the above-described organic EL display device can be used in a large screen.

Figure 16:
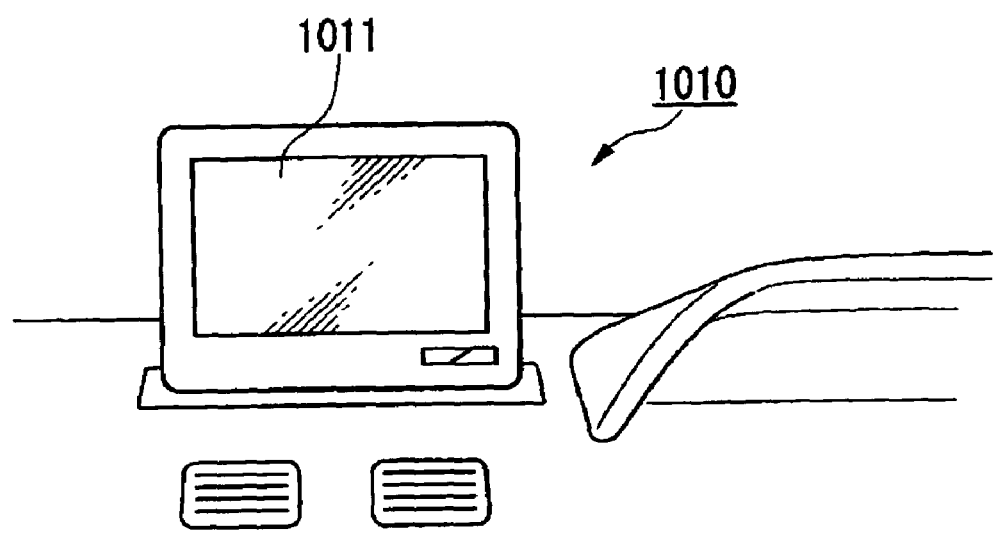
FIG. 16 is a schematic showing another exemplary embodiment of an electronic apparatus according to the present invention.

FIG. 16 shows an example of a car-mounted navigation system. In FIG. 16, reference numeral 1010 denotes a navigation system main unit and 1011 denotes a display unit (a display device) incorporating the electro-optical device of the present invention.

Figure 17:
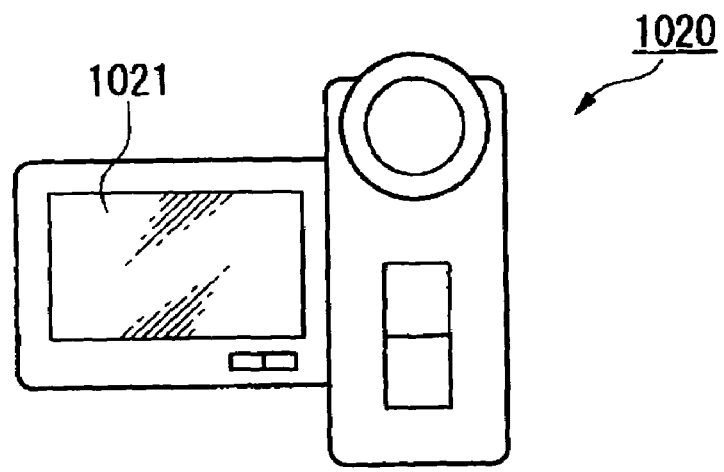
FIG. 17 is a schematic showing another exemplary embodiment of an electronic apparatus according to the present invention.

FIG. 17 shows an example of a portable image-recording apparatus (video camera). In FIG. 17, reference numeral 1020 denotes a recording main unit, and 1021 denotes a display unit incorporating the electro-optical device of the present invention.

Figure 18:
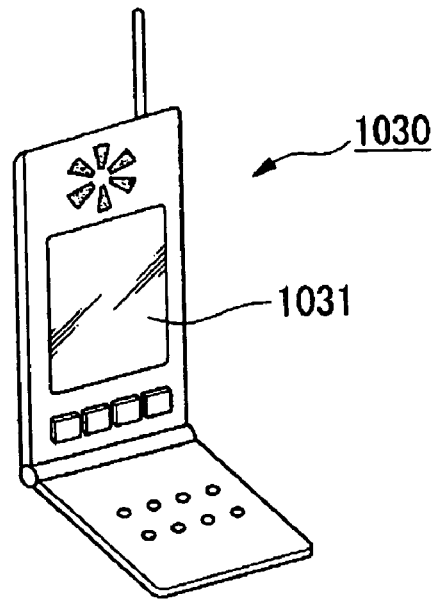
FIG. 18 is a schematic showing another exemplary embodiment of an electronic apparatus according to the present invention.

FIG. 18 shows an example of a cellular phone. In FIG. 18, reference numeral 1030 denotes a cellular phone main unit, and 1031 denotes a display unit (a display device) incorporating the electro-optical device of the present invention.

Figure 19:
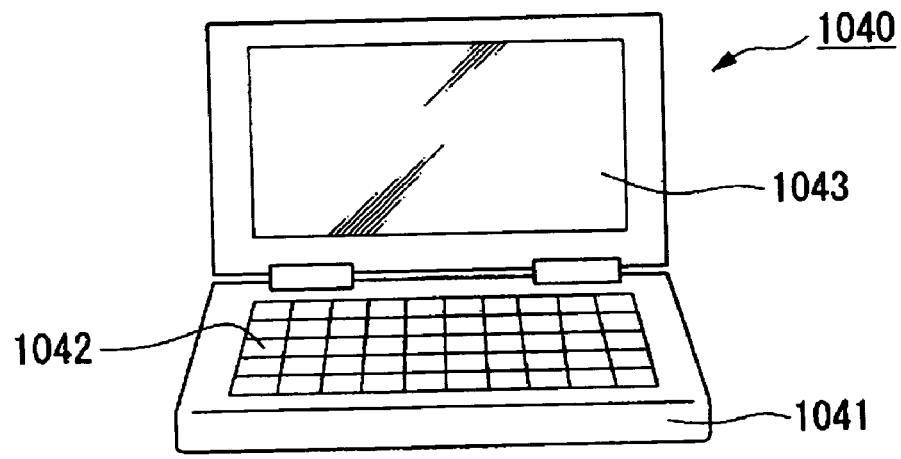
FIG. 19 is a schematic showing another exemplary embodiment of an electronic apparatus according to the present invention.

FIG. 19 shows an example of an information processor such as a word processor or a personal computer. In FIG. 19, reference numeral 1040 denotes an information processor, 1041 denotes an information processing main unit, 1042 denotes an input unit, such as keyboard, and 1043 denotes a display unit incorporating the electro-optical device of the present invention.

Figure 20:
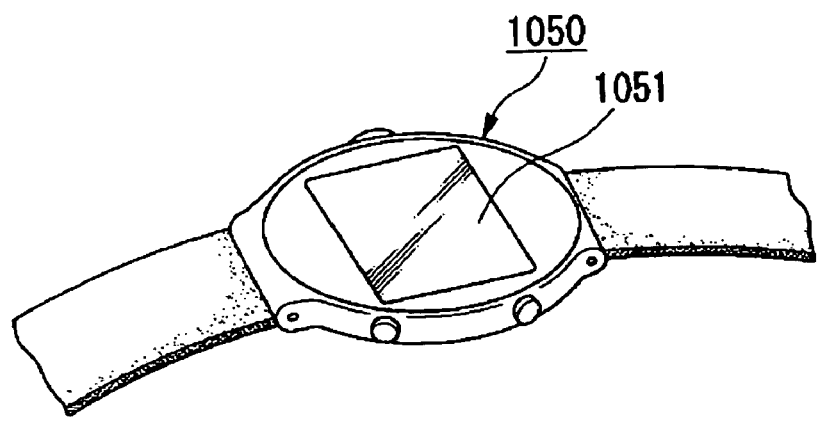
FIG. 20 is a schematic showing another exemplary embodiment of an electronic apparatus according to the present invention.

FIG. 20 shows an example of a wrist-watch-type electronic apparatus. In FIG. 20, reference numeral 1050 denotes a watch main body, and 1051 denotes a display unit incorporating the electro-optical device of the present invention.

Since the electronic apparatuses shown in FIGS. 15 to 20 have the display device incorporating the electro-optical devices of the present invention, highly durable high quality display can be achieved.

The present invention has been described here in terms of exemplary embodiments with reference to the drawings. However, the present invention is not limited by these exemplary embodiments. The shapes and the combinations of the components described above are mere examples, and various modifications are possible depending on the design requirement without departing from the spirit of the present invention.

EFFECTS OF THE INVENTION

According to the substrate and the production method of the present invention, parasitic capacitance in the conductive parts can be reduced, and a substrate with stable performance can be obtained.

According to the electronic device and the production method of the present invention, the function films can exhibit superior performance, and the operation speed can be increased. Thus, an electro-optical device that can be applied to a large-screen device and can exhibit stable performance over a long period of time can be realized.

Moreover, according to the electronic apparatus of the present invention, the display operation has an excellent follow-up property and is stable since the electronic device of the present invention is incorporated as the display device.

The invention claimed is:

1. A wiring substrate, comprising:
a base member having an upper face and wiring lines; and
a component having a dielectric constant of 4 or less disposed on the upper face of the base member, the upper face having a region not provided with the component, the component including porous material.

2. An electro-optical device, comprising:
a substrate;
a wiring line;
a plurality of pixel electrodes disposed on an upper face of a base member including the substrate and the wiring line;
a counter electrode disposed above the pixel electrodes;
functional films each of which includes an electro-optical material and each of which is disposed between one of the plurality of pixel electrodes and the counter electrode; and
a component that is disposed between the counter electrode and the base member,
a dielectric constant of the component being lower than a dielectric constant of the substrate, and
each of the functional films being disposed in one area of areas partitioned by the component.

3. The electro-optical device according to claim 2, the electro-optical material being an organic electroluminescent material.

4. The electro-optical device according to claim 2, the base member further including active elements connected to the pixel electrodes, and the wiring line including signal wiring which supply signals to the active elements.

5. The electro-optical device according to claim 4, at least one barrier layer to prevent migration of substances being provided between the active elements and the component.

6. The electro-optical device according to claim 2, the component including at least one of a spin-on-glass film, a diamond film, and a fluorinated amorphous carbon film including at least one of silica glass, alkylsiloxane polymers, alkylsilsesquioxane polymers, hydride alkylsilsesquioxane polymers, and polyaryl ethers.

7. The electro-optical device according to claim 2, the component including at least one of aerogel, porous silica, gel containing dispersed microparticles of magnesium fluoride, fluoric polymers, porous polymers, and a predetermined substance containing microparticles.

8. The electro-optical device according to claim 2, at least part of the component being covered with a protective film to prevent migration of the substances.

9. An electro-optical device, comprising:
a substrate;
a wiring line;
a plurality of pixel electrodes disposed on an upper face of a base member including the substrate and the wiring line;
a counter electrode disposed above the pixel electrodes;
functional films each of which includes an electro-optical material and each of which is disposed between one of the plurality of pixel electrodes and the counter electrode; and
a component that is disposed between the counter electrode and the base member,
a dielectric constant of the component being 3 or less, and
each of the functional films being disposed in one area of areas partitioned by the component.

10. An electro-optical device, comprising:
a base member having an upper face, an insulating substrate and wiring lines;
a plurality of pixel electrodes disposed on the upper face of the base member;
a counter electrode disposed above the pixel electrodes;
functional films having an electro-optical material disposed between each pixel electrode and the counter electrode; and
a component disposed between the counter electrode and the upper face of the base member and provided around the functional film, a dielectric constant of the component being lower than a dielectric constant of the insulating substrate, the component including a porous material.

11. An electronic apparatus, comprising:
a display device including an electro-optical device including a substrate;

a wiring line;

a plurality of pixel electrodes disposed on an upper face of a base member including the substrate and the wiring line;

a counter electrode disposed above the pixel electrodes;

functional films each of which includes an electro-optical material and each of which is disposed between one of the plurality of pixel electrodes and the counter electrode; and a component that is disposed between the counter electrode and the base member and that is provided around one of the functional films, a dielectric constant of the component being lower than a dielectric constant of the substrate.

* * * * *